US010175540B2

(12) United States Patent
Jeon et al.

(10) Patent No.: US 10,175,540 B2
(45) Date of Patent: Jan. 8, 2019

(54) LIQUID CRYSTAL DISPLAY DEVICE

(71) Applicant: Samsung Display Co. Ltd., Yongin (KR)

(72) Inventors: Hyung Joo Jeon, Suwon-si (KR); Hong Min Yoon, Seoul (KR); Hyoung Cheol Lee, Suwon-si (KR); Pil Gyu Kang, Pyeongtaek-si (KR); Sang Woo Whangbo, Seoul (KR)

(73) Assignee: Samsung Display Co., Ltd. (KR)

( * ) Notice: Subject to any disclaimer, the term of this patent is extended or adjusted under 35 U.S.C. 154(b) by 57 days.

(21) Appl. No.: 15/240,470

(22) Filed: Aug. 18, 2016

(65) Prior Publication Data

US 2017/0108729 A1 Apr. 20, 2017

(30) Foreign Application Priority Data

Oct. 14, 2015 (KR) .................. 10-2015-0143289

(51) Int. Cl.
| | | |
|---|---|---|
| *G02F 1/1339* | (2006.01) | |
| *H01L 27/12* | (2006.01) | |
| *G02F 1/1333* | (2006.01) | |
| *G02F 1/1362* | (2006.01) | |

(52) U.S. Cl.
CPC .... *G02F 1/13394* (2013.01); *G02F 1/133345* (2013.01); *G02F 1/136209* (2013.01); *H01L 27/1248* (2013.01); *H01L 27/1255* (2013.01); *G02F 1/136213* (2013.01); *G02F 2001/13398* (2013.01)

(58) Field of Classification Search
CPC .......... G02F 1/13394; G02F 1/136209; G02F 1/133345; G02F 1/136213; G02F 2001/13398; H01L 27/1248; H01L 27/1255
See application file for complete search history.

(56) References Cited

U.S. PATENT DOCUMENTS

| | | | | |
|---|---|---|---|---|
| 2014/0198286 A1* | 7/2014 | Lee | ................ | G02F 1/133377 349/110 |
| 2014/0267966 A1* | 9/2014 | Won | ................ | G02F 1/133377 349/42 |

FOREIGN PATENT DOCUMENTS

JP 4927640 B2 5/2012

* cited by examiner

*Primary Examiner* — Kevin Quarterman
(74) *Attorney, Agent, or Firm* — Innovation Counsel LLP

(57) ABSTRACT

A display device may include a first pixel electrode, a second pixel electrode, an organic layer, and a light-blocking member. The organic layer may include a first organic portion and a second organic portion. The first organic portion may overlap the first pixel electrode and may be spaced from the second organic portion. The second organic portion may overlap the second pixel electrode. The light-blocking member may be positioned between the first organic portion and the second organic portion.

21 Claims, 13 Drawing Sheets

LIQUID CRYSTAL DISPLAY DEVICE

This application claims priority to Korean Patent Application No. 10-2015-0143289 filed on Oct. 14, 2015 in the Korean Intellectual Property Office; the disclosure of the Korean Patent Application is incorporated herein by reference in its entirety.

BACKGROUND

1. Field

The technical field relates to a liquid crystal display (LCD) device.

2. Description of the Related Art

Generally, a liquid crystal display (LCD) includes an array substrate, a counter substrate which faces the array substrate, and a liquid crystal layer which is interposed between the array substrate and the counter substrate. An LCD may also include a black column spacer (BCS). The BCS maintains a gap between a light-blocking pattern and a substrate.

In manufacturing of an LCD, an alignment layer may be formed after the formation of a BCS pattern. Here, the alignment layer may not be applied on some portions of the BCS pattern due to steps of the BCS pattern. In the portions not applied with the alignment layer, the BCS pattern and liquid crystals may directly contact each other, thus generating unwanted matter. The BCS pattern may become thinner from a central part toward two ends of the BCS pattern. Accordingly, light cannot be completely blocked at these two ends of the BCS pattern. This may result in the leakage of light at these two ends of the BCS pattern.

In some cases, the BCS pattern may be formed in a gate line area and a data line area. The BCS pattern formed in the data line area may have a relatively smaller linewidth than the BCS pattern formed in the gate line area. In this case, the generation of unwanted matter and/or the leakage of light may be more noticeable in the data line area.

SUMMARY

Embodiments may prevent a black column spacer (BCS) pattern and an alignment layer from directly contacting each other in a liquid crystal display (LCD) device, or LCD for conciseness.

Embodiments may be related to an LCD structured with minimum leakage of light.

An embodiment may be related to a display device, such as an LCD. The display device may include a first pixel electrode, a second pixel electrode, an organic layer, and a light-blocking member. The organic layer may include a first organic portion and a second organic portion. The first organic portion may overlap the first pixel electrode (such that a first geometric line perpendicular to a bottom side of the organic layer may cross both the first organic portion and the first pixel electrode) and may be spaced from the second organic portion. The second organic portion may overlap the second pixel electrode (such that a second geometric line perpendicular to the bottom side of the organic layer may cross both the second organic portion and the second pixel electrode). The light-blocking member may be positioned between the first organic portion and the second organic portion.

The display device may include a data line. The organic layer may include a third organic portion. The third organic portion may be positioned between the first organic portion and the second organic portion, may be spaced from each of the first organic portion and the second organic portion, and may overlap the data line (such that a third geometric line perpendicular to the bottom side of the organic layer may cross both the third organic portion and the data line).

At least an edge of the third organic portion may be positioned between two edges of the data line in a plan view of the display device.

The display device may include a first storage electrode and a second storage electrode. The first storage electrode may be electrically connected to the second storage electrode. The data line may be positioned between the first storage electrode and the second storage electrode in a plan view of the display device. An edge of the first organic portion may be positioned between two edges of the first storage electrode in the plan view of the display device.

The display device may include a first color filter. The first color filter may overlap each of the first organic portion and the light-blocking member.

The display device may include a second color filter. The second color filter may overlap each of the second organic portion and the light-blocking member. The organic layer may include a third organic portion. The third organic portion may be positioned between the first organic portion and the second organic portion, may be spaced from each of the first organic portion and the second organic portion, and may overlap an interface between the first color filter and the second color filter (such that a third geometric line perpendicular to the bottom side of the organic layer may cross both the third organic portion and the interface). The display device may include a data line. The interface between the first color filter and the second color filter may be positioned between the data line and the third organic portion.

The display device may include a data line. The data line may overlap the light-blocking member (such that a third geometric line perpendicular to the bottom side of the organic layer may cross both the data line and the light-blocking member). A minimum distance between the first organic portion and the second organic portion may be greater than a width of the data line (in a direction parallel to the bottom side of the organic layer and perpendicular to the data line).

The display device may include a data line. A geometric centerline of the data line may be identical to a geometric centerline of the light-blocking member in a plan view of the display device.

The display device may include a shielding electrode. The organic layer may include a third organic portion. The third organic portion may be positioned between the first organic portion and the second organic portion, may be spaced from each of the first organic portion and the second organic portion, and may directly contact the shielding electrode.

The display device may include a liquid crystal layer, a black spacer, and an alignment layer. The liquid crystal layer may include liquid crystal molecules and may overlap at least one of the first pixel electrode and the second pixel electrode. The black spacer may be positioned between two portions of the liquid crystal layer and may be directly connected to the light-blocking member. The alignment layer may directly contact the light-blocking member, may directly contact the liquid crystal layer, may directly contact at least three sides of the black spacer, and may affect orientations of some of the liquid crystal molecules.

The organic layer may include a third organic portion. The third organic portion may be positioned between the first organic portion and the second organic portion and may overlap the light-blocking member. A minimum thickness of the third organic portion may be less than each of a minimum thickness of the first organic portion and a minimum thickness of the second organic portion (in a direction perpendicular to the bottom side of the organic layer). A maximum thickness of the third organic portion (in the direction perpendicular to the bottom side of the organic layer) may be less than each of the minimum thickness of the first organic portion and the minimum thickness of the second organic portion (in the direction perpendicular to the bottom side of the organic layer).

The display device may include a data line. At least an edge of the data line may be positioned between two ends of the third organic portion in a plan view of the display device.

The third organic portion may be wider than the data line (in a directly parallel to the bottom side of the organic layer and perpendicular to the data line).

The organic layer may include a fourth organic portion. The third organic portion may be positioned between the first organic portion and the fourth organic portion. The fourth organic portion may be positioned between the first organic portion and the second organic portion, may be spaced from each of the first organic portion and the second organic portion, may be connected through the third organic portion to the first organic portion, and may be thicker than the third organic portion (in the direction perpendicular to the bottom side of the organic layer).

The organic layer may include a fifth organic portion. The fourth organic portion may be connected through the fifth organic portion to the second organic portion. The fifth organic portion may be positioned between the fourth organic portion and the second organic portion and may be thinner than each of the fourth organic portion and the second organic portion (in the direction perpendicular to the bottom side of the organic layer).

The display device may include a data line. A first edge of the data line may be positioned between two ends of the third organic portion in a plan view of the display device. A second edge of the data line may be positioned between two ends of the fifth organic portion in the plan view of the display device.

The display device may include a storage electrode. An edge of the first organic portion may be positioned between two edges of the storage electrode in a plan view of the display device. An edge of the storage electrode may be positioned between two ends of the third organic portion in the plan view of the display device.

An embodiment may be related to a liquid crystal display (LCD) device, or LCD for conciseness. The LCD may include the following elements: a first substrate and a second substrate which face each other and comprise a pixel area; a liquid crystal layer which is disposed between the first substrate and the second substrate; an organic layer which is disposed on the first substrate and comprises an opening structure/set (or through-hole structure/set) extending in a first direction along a side of the pixel area; and a light-blocking member which is disposed inside the opening structure/set of the organic layer.

The LCD may include a data line which is disposed on the first substrate and extends in the first direction, wherein the opening structure/set comprises a first opening formed on a first side of the data line and a second opening formed on a second side of the data line, which is opposite the first side.

The light-blocking member may include a first light-blocking portion and a second light-blocking portion respectively positioned inside the first opening and the second opening, wherein at least part of each of the first light-blocking portion and the second light-blocking portion overlaps the data line.

The LCD may include a storage electrode line which is disposed on the first substrate, wherein the storage electrode line comprises a first storage electrode and a second storage electrode which extend in the first direction, wherein the first storage electrode is separated from a first side of the data line by a predetermined distance, and wherein the second storage electrode is separated from a second side of the data line by the predetermined distance.

At least part of the first storage electrode overlaps the first light-blocking portion, and at least part of the second storage electrode overlaps the second light-blocking portion.

The LCD may include a color filter which is disposed on the first substrate and under the organic layer, wherein at least part of the color filter overlaps (and directly contacts) the light-blocking member.

The LCD may include a data line which is disposed on the first substrate and extends in the first direction, wherein a width of the opening structure is greater than a width of the data line, and at least part of the data line is overlaps the light-blocking member.

A centerline of the data line is substantially identical to a centerline of the light-blocking member in cross-sectional view or plan view of the LCD.

The LCD may include a shielding electrode which is disposed on the organic layer and extends along the side of the pixel area.

The LCD may include the following elements: a gate line which is disposed on the first substrate to extend in a second direction; and a pixel electrode which is disposed on the organic layer, wherein the pixel electrode comprises a first subpixel electrode disposed on a first side of the gate line and a second subpixel electrode disposed on a second side of the gate line which is opposite the first side of the gate line.

The LCD may include an alignment layer which is disposed on the light-blocking member.

The LCD may include a column spacer which is disposed on the light-blocking member, wherein the light-blocking member and the column spacer are directly connected to each other.

An embodiment may be related to an LCD. The LCD may include the following element: a first substrate and a second substrate which face each other and comprise a pixel area; a liquid crystal layer which is disposed between the first substrate and the second substrate; an organic layer which is disposed on the first substrate and comprises a step structure/set (or recess structure/set) extending in a first direction along a side of the pixel area; and a light-blocking member which is disposed inside the step structure/set (or recess structure/set) of the organic layer.

The LCD may include a data line which is disposed on the first substrate and extends in the first direction, wherein the step structure/set comprises a first step (or first recess) formed on a first side of the data line and a second step (or second recess) formed on a second side of the data line which is opposite the first side of the data line.

The light-blocking member may include a first light-blocking portion and a second light-blocking portion that respectively contact (and are respectively positioned inside) the first step (or first recess) and the second step (or second recess), wherein at least part of each of the first light-blocking portion and the second light-blocking portion overlaps the data line.

The LCD may include a storage electrode line which is disposed on the first substrate, wherein the storage electrode line comprises a first storage electrode and a second storage electrode which extend in the first direction, wherein the first storage electrode is separated from a first side of the data line by a predetermined distance, and wherein the second storage electrode is separated from a second side of the data line by the predetermined distance.

At least part of the first storage electrode overlaps the first light-blocking portion, and at least part of the second storage electrode overlaps the second light-blocking portion.

The LCD may include a data line which is disposed on the first substrate and extends in the first direction, wherein a width of the step structure is greater than a width of the data line, and at least part of the data line overlaps the light-blocking member, which is disposed inside the step structure.

A centerline of the data line is substantially identical to a centerline of the step structure.

The LCD may include the following elements: a column spacer which is disposed on the light-blocking member; and an alignment layer which is disposed on the light-blocking member and the column spacer, wherein the light-blocking member and the column spacer are directly connected to each other.

DETAILED DESCRIPTION OF EMBODIMENTS

Figure 1:
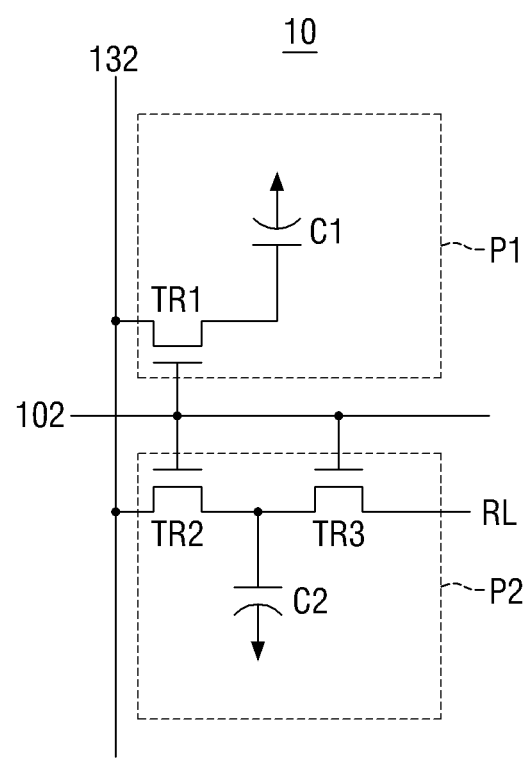
FIG. 1 is an equivalent circuit diagram of one pixel of a liquid crystal display (LCD) according to an embodiment.

Embodiments are described with reference to the accompanying drawings, wherein like reference numerals may refer to like elements. The embodiments may have different forms and should not be construed as being limited to the descriptions set forth herein. Although the terms "first", "second", etc. may be used herein to describe various elements, these elements should not be limited by these terms. These terms may be used to distinguish one element from another element. Thus, a first element recited in this application may be termed a second element without departing from embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The description that a first element is connected to or coupled to a second element includes both a case where the first element is directly connected to the second element and a case where an intervening element is interposed between the first element and the second element. However, the description that a first element is directly connected or directly coupled to a second element indicates that there is no intervening element intended between the first element and the second element. The term "and/or" may include any and all combinations of one or more of the associated items.

A singular expression in the present specification may also include a plural expression. The terms "comprise" and/or "comprising" do not exclude the possibility of existence or addition of one or more other components, steps, operations, and/or devices.

Embodiments may be applicable to one or more of vertical alignment (VA) mode or patterned vertical alignment (PVA) mode display devices, in-plane switching (IPS) display devices, plane-line switching (PLS) display devices, fringe-field switching (FFS) display devices, twisted nematc (TN) display devices, and other electrically-controlled birefringence (ECB) display devices.

Embodiments may be applicable to one or more of display devices in a common electrode on top configuration and to display devices in a common electrode on bottom configuration.

Figure 2:
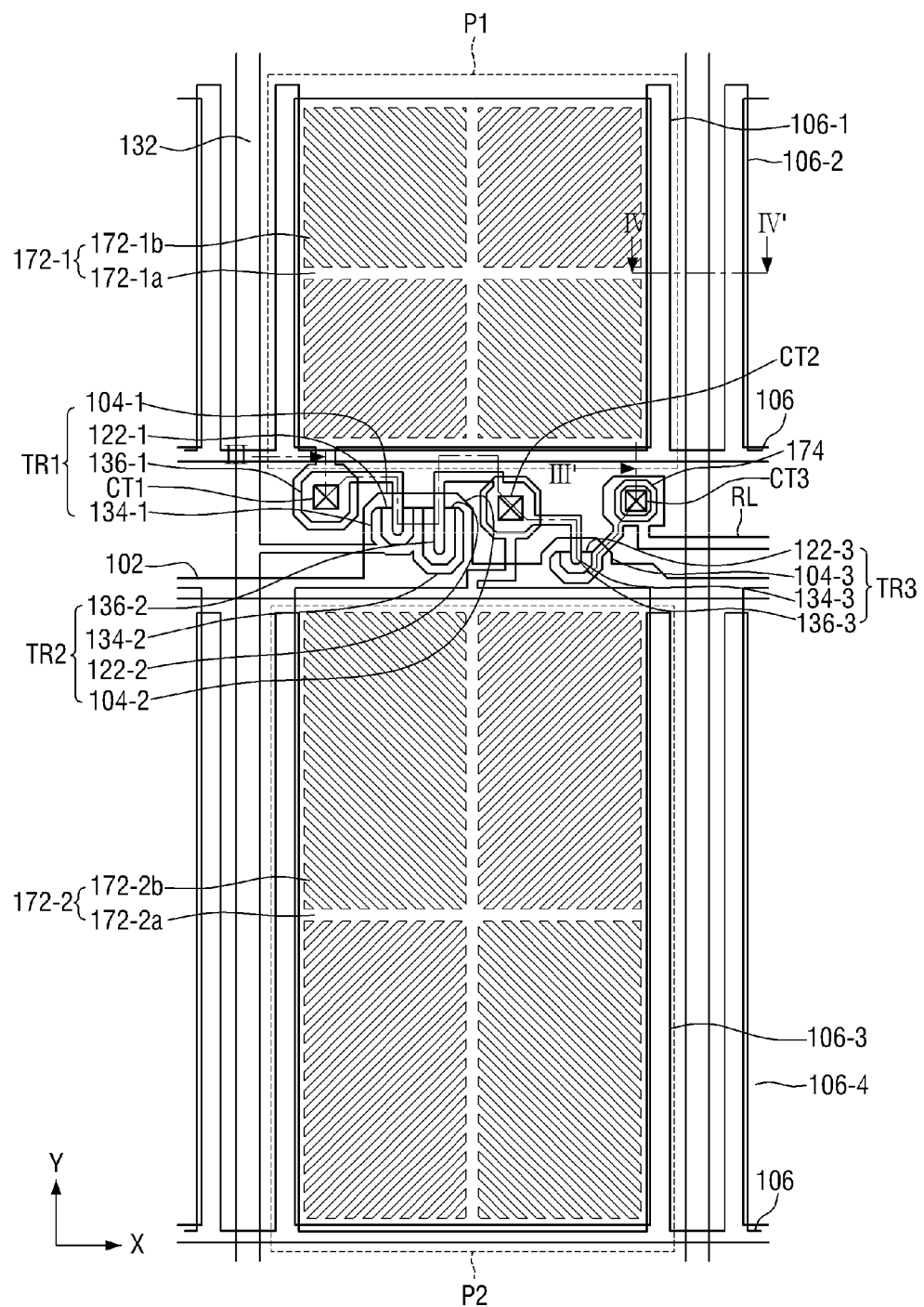
FIG. 2 is a schematic layout view illustrating a pixel of an LCD according to an embodiment.
Figure 3:
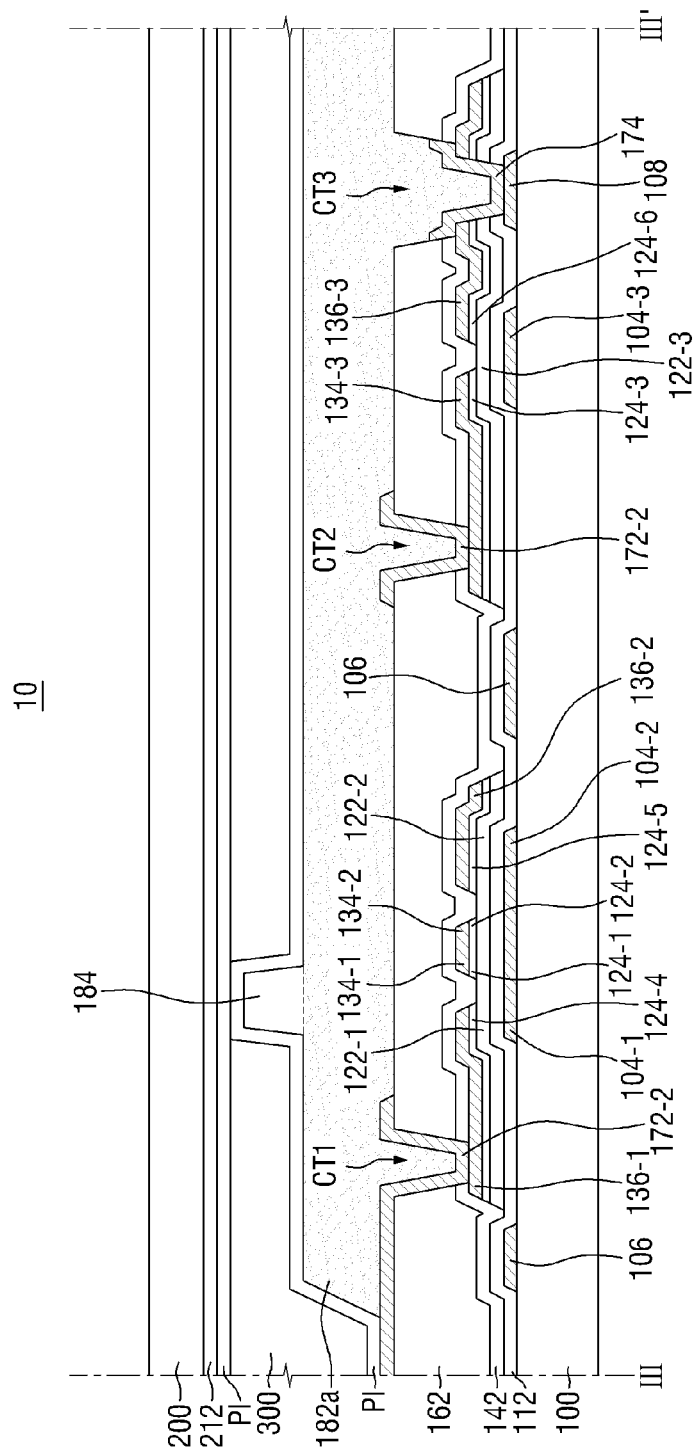
FIG. 3 is a schematic cross-sectional view taken along the line of FIG. 2.

FIG. 1 is an equivalent circuit diagram of one pixel of a liquid crystal display (LCD) 10 according to an embodiment. FIG. 2 is a layout view illustrating the pixel of the LCD 10. FIG. 3 is a cross-sectional view taken along the line of FIG. 2.

Referring to FIGS. 1 and 2, a pixel of the LCD 10 according to the current embodiment may include two pixel areas, i.e., a first subpixel area P1 and a second subpixel area P2. In addition, the pixel of the LCD 10 may include a gate line 102 which delivers a gate signal, a data line 132 which delivers a data voltage, a voltage dividing reference line RL to which a certain voltage is applied, a first thin-film transistor (TFT) TR1, a second TFT TR2, and a third TFT TR3.

The first TFT TR1 and the second TFT TR2 may be connected to the same gate line 102 and the same data line 132. The third TFT TR3 may be connected to the same gate line 102 to which the first TFT TR1 and the second TFT TR2 are connected, the second TFT TR2, and the voltage dividing reference line RL.

A first liquid crystal capacitor C1 connected to the first TFT TR1 is formed in the first subpixel area P1, and a second liquid crystal capacitor C2 connected to the second TFT TR2 and the third TFT TR3 is formed in the second subpixel area P2.

The first TFT TR1 may have a first terminal connected to the gate line 102, a second terminal connected to the data line 132, and a third terminal connected to the first liquid crystal capacitor C1. The third terminal of the first TFT TR1 may be connected to a first subpixel electrode 172-1 that forms the first liquid crystal capacitor C1.

The second TFT TR2 may have a first terminal connected to the gate line 102, a second terminal connected to the data line 132, and a third terminal connected to the second liquid crystal capacitor C2. In particular, the third terminal of the second TFT TR2 may be connected to a second subpixel electrode 172-2 that forms the second liquid crystal capacitor C2.

The third TFT TR3 may have a first terminal connected to the gate line 102, a second terminal connected to the voltage dividing reference line RL, and a third terminal connected to the third terminal of the second TFT TR2. A certain voltage may be applied to the second terminal of the third TFT TR3.

In the operation of the LCD 10 according to the current embodiment, when a gate-on voltage is applied to the gate line 102, all of the first through third TFTs TR1 through TR3 connected to the gate line 102 are turned on, and the first liquid crystal capacitor C1 and the second liquid crystal capacitor C2 are charged with a data voltage delivered through the data line 132. Here, the same data voltage is applied to the first subpixel electrode 172-1 and the second subpixel electrode 172-2, and the first liquid crystal capacitor C1 and the second liquid crystal capacitor C2 are charged with a difference between a common voltage and the data voltage.

At this same time, since the third TFT TR3 is turned on, the data voltage delivered to the second subpixel area P2 through the data line 132 is divided by the third TFT TR3 connected in series to the second TFT TR2. Here, the data voltage is distributed between the second TFT TR2 and the third TFT TR3 according to the sizes of channels of the second TFT TR2 and the third TFT TR3. Therefore, even if the same data voltage is delivered to the first subpixel area P1 and the second subpixel area P2 through the data line 132, the first liquid crystal capacitor C1 and the second liquid crystal capacitor C2 may be charged with different voltages. That is, the voltage charged in the second liquid crystal capacitor C2 is lower than the voltage charged in the first liquid crystal capacitor C1.

Accordingly, the first and second subpixel electrodes 172-1 and 172-2 in one pixel may be charged with different voltages, thereby improving lateral visibility. A voltage applied to the second terminal of the third TFT TR3 may have a higher level than the common voltage applied to a common electrode. In an example, when the common voltage is approximately 7 V, the voltage applied to the second terminal of the third TFT TR3 may be, but is not limited to, approximately 8 to 11 V.

Referring to FIGS. 2 and 3, the LCD 10 according to the current embodiment includes a first substrate 100 and a second substrate 200 which face each other and a liquid crystal layer 300 which is interposed between the first substrate 100 and the second substrate 200.

Each of the first substrate 100 and the second substrate 200 may include an insulating material such as transparent glass, quartz, ceramic, silicon or transparent plastic selected appropriately as desired by those of ordinary skill in the art. The first substrate 100 and the second substrate 200 may be placed to face each other.

In some embodiments, each of the first substrate 100 and the second substrate 200 may have flexibility. That is, each of the first substrate 100 and the second substrate 200 may be a deformable substrate that can be rolled, folded or bent.

The gate line 102 may be located on the first substrate 100. The gate line 102 may extend mainly in a first direction (e.g., an X direction) and delivers a gate signal.

A first gate electrode 104-1 and a second gate electrode 104-2 which protrude from the gate line 102 and are connected to each other may be located on the first substrate 100. In addition, a third gate electrode 104-3 which protrudes from the gate line 102 and is separated from the first gate electrode 104-1 and the second gate electrode 104-2 may be located on the first substrate 100. The first through third gate electrodes 104-1 through 104-3 may be connected to the same gate line 102 and receive the same gate signal.

Each of the gate line 102, the first gate electrode 104-1, the second gate electrode 104-2 and the third gate electrode 104-3 may be made of aluminum (Al)-based metal such as aluminum and an aluminum alloy, silver (Ag)-based metal such as silver and a silver alloy, copper (Cu)-based metal such as copper and a copper alloy, molybdenum (Mo)-based metal such as molybdenum and a molybdenum alloy, chrome (Cr), titanium (Ti), or tantalum (Ta). In addition, each of the gate line 102, the first gate electrode 104-1, the second gate electrode 104-2 and the third gate electrode 104-3 may have a single layer structure or a multilayer structure composed of two conductive layers with different physical characteristics. One of the two conductive layers may be made of metal with low resistivity, such as aluminum-based metal, silver-based metal or copper-based metal, in order to reduce a signal delay or a voltage drop. The other one of the conductive layers may be made of a different material, in particular, a material having superior contact characteristics with indium tin oxide (ITO) and indium zinc oxide (IZO), such as molybdenum-based metal, chrome, titanium, or tantalum. Examples of the multilayer structure include a chrome lower layer and an aluminum upper layer and an aluminum lower layer and a molybdenum upper layer. In some embodiments, each of the gate line 102, the first gate electrode 104-1, the second gate electrode 104-2 and the third gate electrode 104-3 can be made of various metals and conductors.

A gate insulating layer 112 may be located on the gate line 102 and the first through third gate electrodes 104-1 through 104-3. The gate insulating layer 112 may be made of an inorganic insulating material such as silicon oxide, silicon nitride, or silicon oxynitride. The gate insulating layer 112 may have a single layer structure or a multilayer structure composed of at least two insulating layers with different physical characteristics.

A first semiconductor layer 122-1, a second semiconductor layer 122-2, and a third semiconductor layer 122-3 are formed on the gate insulating layer 112. The first semiconductor layer 122-1 may be located on the first gate electrode 104-1, the second semiconductor layer 122-2 may be located on the second gate electrode 104-2, and the third semiconductor layer 122-3 may be located on the third gate electrode 104-3. In some embodiments, a semiconductor member 122-4 may further be located under the data line 132. Each of the first semiconductor layer 122-1, the second semiconductor layer 122-1, the third semiconductor layer 122-3 and the semiconductor member 122-4 may include amorphous silicon, polycrystalline silicon, or oxide semiconductor.

A plurality of ohmic contact members (124-1 through 124-7) may be located on the first semiconductor layer 122-1, the second semiconductor layer 122-2 and the third semiconductor layer 122-3. The ohmic contact members (124-1 through 124-7) may include source ohmic contact members 124-1 through 124-3 located under first through third source electrodes 134-1 through 134-3 which will be described later and drain ohmic contact members 124-4 through 125-6 located under first through third drain electrode 136-1 through 136-3. In some embodiments, the ohmic contact members (124-1 through 124-7) may further include a data ohmic contact member 124-7 located under the data line 132. The data ohmic contact member 124-7 may be located between the data line 132 and the semiconductor member 122-4. In some embodiments, the ohmic contact members (124-1 through 124-7) may be made of n+ hydrogenated amorphous silicon heavily doped with an n-type impurity or may be made of silicide. In some embodiments, when the first semiconductor layer 122-1, the second semiconductor layer 122-2, the third semiconductor layer 122-3 and the semiconductor member 122-4 are oxide semiconductors, the ohmic contact members (124-1 through 124-7) can be omitted.

The data line 132, the first source electrode 134-1, the first drain electrode 136-1, the second source electrode 134-2, the second drain electrode 136-2, the third source electrode 134-2 and the third drain electrode 136-3 may be disposed on the ohmic contact members (124-1 through 124-7) and the gate insulating layer 112.

The data line 132 delivers a data voltage and extends mainly in a second direction (e.g., a Y direction) to intersect the gate line 102. The gate line 102 and the data line 132 may be arranged to intersect each other, thereby defining each pixel area. That is, each pixel area may be surrounded by the gate line 102 and the data line 132.

The first source electrode 134-1 protrudes from the data line 132 onto the first gate electrode 104-1. In some embodiments, the first source electrode 134-1 disposed on the first gate electrode 104-1 may be bent in a 'C' shape or a different shape.

The first drain electrode 136-1 may be disposed on the first gate electrode 104-1 to be separated from the first source electrode 134-1. A channel may be formed in a portion of the first semiconductor layer 122-1 which is exposed between the first source electrode 134-1 and the first drain electrode 136-1 separated from each other.

The second source electrode 134-2 protrudes from the data line 132 onto the second gate electrode 104-2. The second source electrode 134-2 disposed on the second gate electrode 104-2 may be bent in a 'C' shape or a different shape.

The second drain electrode 136-2 may be disposed on the second gate electrode 104-2 to be separated from the second source electrode 134-2. A channel may be formed in a portion of the second semiconductor layer 122-2 which is exposed between the second source electrode 134-2 and the second drain electrode 136-2 separated from each other. The second drain electrode 136-2 may include an enlarged portion.

The third source electrode 134-3 may be connected to the second drain electrode 136-2 and disposed on the third gate electrode 104-3 to be separated from the third drain electrode 136-3. A channel may be formed in a portion of the third semiconductor layer 122-3 which is exposed between the third source electrode 134-3 and the third drain electrode 136-3 separated from each other.

The third drain electrode 136-3 may protrude onto the third gate electrode 104-3. The third drain electrode 134-3 may be electrically connected to the voltage dividing reference line RL by a third contact hole CT3 to receive a certain voltage from the voltage dividing reference line RL. In some embodiments, the voltage dividing reference line RL may be disposed at the same level as the gate line 102. The third contact hole CT3 may be formed in an organic layer 162, the data line 132, the semiconductor member 122-4 and the data ohmic contact member 124-7 to expose at least a portion of the voltage dividing reference line RL. The exposed portion of the voltage dividing reference line RL may be electrically connected to the third drain electrode 136-3 by a floating electrode 174 disposed in the third contact hole CT3. In some embodiments, although not illustrated in the drawings, the third drain electrode 136-3 may be electrically connected to a storage electrode line 106, which is disposed at the same level as the gate line 102, by a contact structure and receive a certain voltage from the storage electrode line 106.

Each of the data line 132, the first source electrode 134-1, the first drain electrode 136-1, the second source electrode 134-2, the second drain electrode 136-2, the third source electrode 134-3 and the third drain electrode 136-3 may be made of aluminum, copper, silver, molybdenum, chrome, titanium, tantalum, or an alloy of the same. Each of the data line 132, the first source electrode 134-1, the first drain electrode 136-1, the second source electrode 134-2, the second drain electrode 136-2, the third source electrode 134-3 and the third drain electrode 134-3 may have a multilayer structure composed of a lower layer (not illustrated) made of refractory metal and an upper layer (not illustrated) made of a material with low resistivity.

The first gate electrode 104-1, the first semiconductor layer 122-1, the first source electrode 134-1, and the first drain electrode 136-1 may form the first TFT TR1. In addition, the second gate electrode 104-2, the second semiconductor layer 122-2, the second source electrode 134-2, and the second drain electrode 136-2 may form the second TFT TR2. The third gate electrode 104-3, the third semiconductor layer 122-3, the third source electrode 134-3, and the third drain electrode 136-3 may form the third TFT TR3.

A first passivation layer 142 may be located on the data line 132, the first through third source electrodes 134-1 through 134-3, and the first through third drain electrodes 136-1 through 136-3. The first passivation layer 142 may include an organic insulating material or an inorganic insulating material such as silicon oxide, silicon nitride or silicon oxynitride. The first passivation layer 142 may protect the first through third TFTs TR1 through TR3 and prevent a material contained in the organic layer 162 from being introduced into the first through third semiconductor layers 122-1 through 122-3.

The organic layer 162 may be disposed on the first passivation layer 142. The organic layer 162 may include a material having superior planarization characteristics and photosensitivity. A first contact hole CT1 which partially exposes the first drain electrode 136-1 and a second contact hole CT2 which partially exposes the second drain electrode 136-2 may be formed in the first passivation layer 142 and the organic layer 162.

The structure of the organic layer 162 will be described below.

Figure 4:
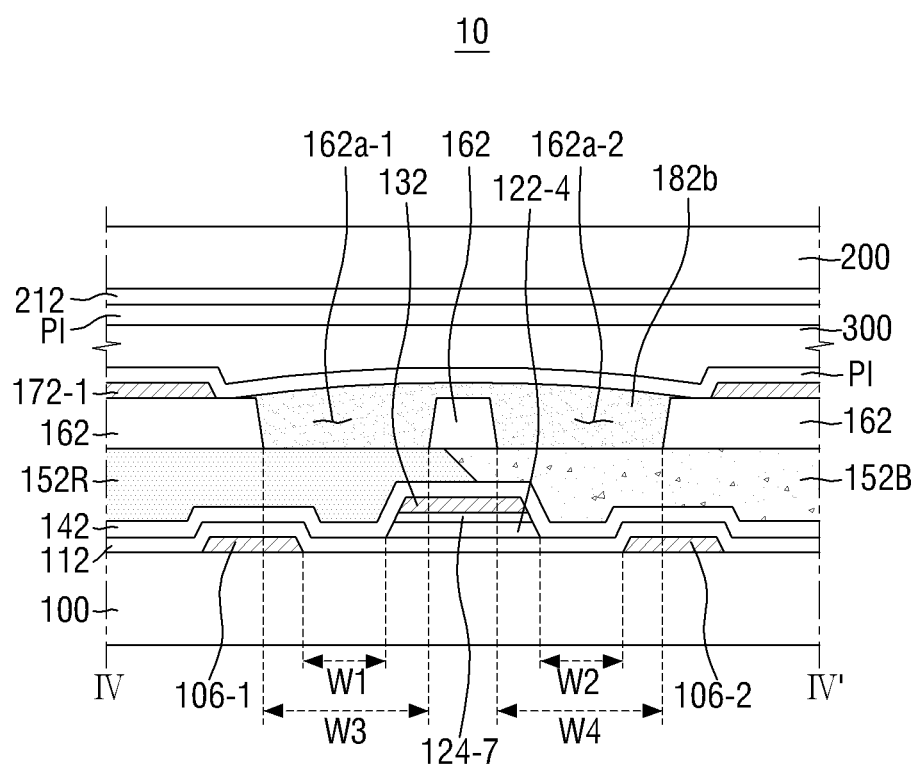
FIG. 4 is a schematic cross-sectional view taken along the line IV-IV' of FIG. 2.

In some embodiments, color filters may be disposed between the organic layer 162 and the first passivation layer 142. The color filters may include a red color filter, a green color filter, and a blue color filter. Each of the red, green and blue color filters is formed in one pixel, thereby forming a red, green or blue pixel. As illustrated in FIG. 4, a red color filter 152R and a blue color filter 152B neighbor each other in adjacent pixels. Each of the color filters (152R and 152B) may overlap a pixel electrode (172-1 and 172-2). The color filters (152R and 152B) may include photosensitive organic matter that contains a pigment. The organic layer 162 may be disposed on the color filters (152R and 152B) to planarize steps between the red, green and blue color filters. In the embodiment of FIG. 3, although not illustrated in the drawing, a color filter may be disposed on the first through third TFTs TR1 through TR3. That is, the color filter may be disposed not only in an area that overlaps the pixel electrode (172-1 and 172-2) but also at a boundary between the first pixel electrode 172-1 and the second pixel electrode 172-2.

The pixel electrode (172-1 and 172-2) may be disposed on the organic layer 162 in each unit pixel. In some embodiments, the pixel electrode (172-1 and 172-2) may include the first subpixel electrode 172-1 and the second subpixel electrode 172-2. When seen from above, the first subpixel electrode 172-1 and the second subpixel electrode 172-2 may be arranged along the second direction (or the Y direction) with the gate line 102 interposed therebetween. That is, in an exemplary embodiment, the first subpixel electrode 172-1 may be located above the gate line 102 in the second direction (or the Y direction), and the second subpixel electrode 172-2 may be located below the gate line 102 in the second direction (or the Y direction).

The first subpixel electrode 172-1 may be connected to the first drain electrode 136-1 by the first contact hole CT1, and the second subpixel electrode 172-2 may be connected to the second drain electrode 136-2 by the second contact hole CT2.

The first subpixel electrode 172-1 and the second subpixel electrode 172-2 receive data voltages from the first drain electrode 136-1 and the second drain electrode 136-2, respectively. Here, part of the data voltage applied to the second drain electrode 136-2 is divided by the third source electrode 134-3. Accordingly, a second subpixel voltage applied to the second subpixel electrode 172-2 becomes smaller in magnitude than a first subpixel voltage applied to the first subpixel electrode 172-1. This applies to a case where the data voltage applied to each of the first subpixel electrode 172-1 and the second subpixel electrode 172-2 has a positive polarity (+). When the data voltage applied to each of the first subpixel electrode 172-1 and the second subpixel electrode 172-2 has a negative polarity (−), the first subpixel voltage applied to the first subpixel electrode 172-1 becomes smaller in magnitude than the second subpixel voltage applied to the second subpixel electrode 172-2.

The first subpixel electrode 172-1 includes a first stem 172-1a and a plurality of branches 172-1b extending radially from the first stem 172-1a. The first stem 172-1a may be provided in various shapes. In an example, the first stem 172-1a may be cross-shaped as illustrated in FIG. 2. In this case, a first subpixel may be divided into four domains by the first stem 172-1a.

The first branches 172-1b may extend in different directions in different domains. The first branches 172-1b may extend parallel to each other and separated from each other in each domain defined by the first stem 172-1a. The first branches 172-1b adjacent to each other may be separated from each other by a distance of a micrometer unit, thereby forming a plurality of micro slits.

The first subpixel electrode 172-1 may be made of a transparent conductive material. For example, the first subpixel electrode 172-1 may be made of a transparent conductive material such as ITO, IZO, indium tin zinc oxide (ITZO) or aluminum-doped zinc oxide (AZO).

Liquid crystal molecules of the liquid crystal layer 300 which overlaps the first subpixel electrode 172-1 are pretilted in a different direction in each domain by the micro slits. For example, the liquid crystal molecules may tilt in four directions toward the first stem 172-1a. Therefore, four domains having different alignment directions of the liquid crystal molecules are formed in the liquid crystal layer 300. If the liquid crystal molecules are made to tilt in various directions in this way, a standard viewing angle of the LCD 10 can be increased.

The second subpixel electrode 172-2 includes a second stem 172-2a and a plurality of second branches 172-2b extending radially from the second stem 172-2a. That is, the second subpixel electrode 172-2 may have substantially the same configuration as the first subpixel electrode 172-1. Therefore, a detailed description of the configuration of the second subpixel electrode 172-2 is omitted.

When seen from above, the area of the second subpixel electrode 172-2 may be larger than that of the first subpixel electrode 172-1.

The storage electrode line 106 may further be located on the first substrate 100. The storage electrode line 106 may extend in substantially the same direction (e.g., a horizontal direction) as the gate line 102. The storage electrode line 106 may be located on the same layer as the first through third gate electrodes 104-1 through 104-3 and may be made of the same material as the first through third gate electrodes 104-1 through 104-3. That is, in an exemplary embodiment, the storage electrode line 106 may be located between the first substrate 100 and the gate insulating layer 112 and may be made of the same material as the gate line 102. However, this is merely an example, and the position of the storage electrode line 106 is not limited to this example.

In some embodiments, the storage electrode line 106 may include a first storage electrode 106-1, a second storage electrode 106-2, a third storage electrode 106-3, and a fourth storage electrode 106-4. The first storage electrode 106-1, the second storage electrode 106-2, the third storage electrode 106-3 and the fourth storage electrode 106-4 may extend along the second direction (e.g., the Y direction). The first storage electrode 106-1 and the second storage electrode 106-2 may be disposed in the first subpixel area P1, and the third storage electrode 106-3 and the fourth storage electrode 106-4 may be disposed in the second subpixel area P2.

Referring to FIG. 2, when seen from above, the first storage electrode 106-1 and the second storage electrode 106-2 may be disposed on a side (a left side in the drawing) and the other side (a right side in the drawing) of the data line 132, respectively. The first storage electrode 106-1 may be separated to the left from the data line 132 by a predetermined distance, and the second storage electrode 106-2 may be separated to the right from the data line 132 by a predetermined distance.

Referring to FIG. 2, when seen from above, the third storage electrode 106-3 and the fourth storage electrode 106-4 may be disposed on a side (the left side in the drawing) and the other side (the right side in the drawing) of the data line 132, respectively. The third storage electrode 106-3 may be separated to the left from the data line 132 by a predetermined distance, and the fourth storage electrode 106-4 may be separated to the right from the data line 132 by a predetermined distance.

In some embodiments, each of the first storage electrode 106-1, the second storage electrode 106-2, the third storage electrode 106-3, and the fourth storage electrode 106-4 may include a portion located between the data line 132 and the pixel electrode (172-1 and 172-2). In addition, each of the first storage electrode 106-1, the second storage electrode 106-2, the third storage electrode 106-3, and the fourth storage electrode 106-4 may partially overlap the pixel electrode (172-1 and 172-2) as illustrated in FIG. 2.

A light-blocking member (182a and 182b) may be disposed on the organic layer 162 and the pixel electrode (172-1 and 172-2). The light-blocking member (182a and 182b) prevents the leakage of light. The light-blocking member (182a and 182b) may be disposed in the first through third TFTs TR1 through TR3 and a non-pixel area (between pixels, a gate line area and a data line area).

In some embodiments, the light-blocking member (182a and 182b) may directly contact part of each of the first subpixel electrode 172-1 and the second subpixel electrode 172-2 and part of the organic layer 162. In addition, at least part of the light-blocking member (182a and 182b) may fill the first contact hole CT1, the second contact hole CT2, and the third contact hole CT3.

The light-blocking member (182a and 182b) may be made of a black organic polymer material that contains black dye or pigment or a metal (metal oxide) such as chrome or chrome oxide.

In some embodiments, the light-blocking member (182a and 182b) may include a first light-blocking member 182a and a second light-blocking member 182b. The first light-blocking member 182a may extend in the first direction (the X direction), and the second light-blocking member 182b may extend in the second direction (the Y direction). As illustrated in FIG. 2, the first light-blocking member 182a may be disposed on the first through third TFTs TR1 through TR3 and the gate line 102, and the second light-blocking member 182b may be disposed on the data line 132.

A column spacer 184 is designed to maintain a gap between the first substrate 100 and the second substrate 200. In some embodiments, an end of the column spacer 184 may contact the second substrate 200 as illustrated in FIG. 3. However, this is merely an example, and the end of the column spacer 184 can also be separated from the second substrate 200 by a predetermined distance.

Although not illustrated in the drawings, the column spacer 184 may include a plurality of column spacers having different step heights. For example, the column spacer 184 may include a main column spacer having a relatively high step height and a sub-column spacer having a relatively low step height. In this case, the gap between the first substrate 100 and the second substrate 200 may be maintained primarily by the main column spacer. When the main column spacer fails to exert its function, the gap between the first substrate 100 and the second substrate 200 may be maintained secondarily by the sub-column spacer.

Referring to FIG. 3 and FIG. 4, the column spacer 184 may be disposed on the light-blocking member (182a and 182b). The column spacer 184 may be disposed in an area corresponding to a TFT. In the embodiment of FIG. 3, the column spacer 184 overlaps the first TFT TR1. Since the column spacer 184 is placed to overlap a TFT, the size of the light-blocking member (182a and 182b) can be relatively reduced, and an aperture ratio of the LCD 10 can be improved.

In some embodiments, the column spacer 184 may include a light-blocking pigment and may be made of the same material as the light-blocking member (182a and 182b). In some embodiments, the column spacer 184 may be integrally formed with the light-blocking member (182a and 182b) and may be formed at the same time as the light-blocking member (182a and 182b) by a single photography process using a slit mask or a halftone mask.

A common electrode 212 may be disposed on the second substrate 200. When receiving the common voltage, the common electrode 212 may form an electric field together with the pixel electrode (172-1 and 172-2), thereby controlling the alignment direction of the liquid crystal molecules included in the liquid crystal layer 300.

The common electrode 212 may be formed as a single piece over the entire pixel area surrounded by the gate line 102 and the data line 132. The common electrode 212 may be made of, but not limited to, a transparent conductive material such as ITO or IZO.

An alignment layer PI may be disposed on each of a surface of the first substrate 100 and a surface of the second substrate 200 which face the liquid crystal layer 300. That is, the alignment layer PI that can align the liquid crystal layer 300 may be disposed on the pixel electrode (172-1 and 172-2), the light-blocking member (182a and 182b), and the column spacer 184. The alignment layer PI may include a resin polymer such as polyimide, polyamic acid, polyamide, polyamic imide, polyester, polyethylene, polyurethane or polystyrene, or a mixture of the same. In addition, the alignment layer PI may include a monomer of the above resin polymer.

The liquid crystal layer 300 may be interposed between the first substrate 100 and the second substrate 200. The liquid crystal layer 300 may include a plurality of liquid crystal molecules having dielectric anisotropy. The liquid crystal molecules may be vertically aligned liquid crystal molecules which are aligned between the first substrate 100 and the second substrate 200 in a direction perpendicular to the first substrate 100 and the second substrate 200. When an electric field is applied to between the first substrate 100 and the second substrate 200, the liquid crystal molecules may rotate in various directions between the first substrate 100 and the second substrate 200, thereby transmitting or blocking light. Here, the term 'rotate' may denote not only that the liquid crystal molecules actually rotate but also that the alignment of the liquid crystal molecules is changed by the electric field. In some embodiments, the liquid crystal layer 300 may include reactive mesogens which are polymerized by light such as ultraviolet light or a pretilt providing polymer formed by the polymerization of the reactive mesogens. The pretilt providing polymer may cause the liquid crystal molecules to pretilt even in a state in which an electric field has not been generated between the first substrate 100 and the second substrate 200.

The alignment layer PI is formed after the formation of the light-blocking member (182a and 182b). Here, the alignment layer PI may not be applied on some portions of the light-blocking member (182a and 182b) due to steps of the light-blocking member (182a and 182b). In the portions not applied with the alignment layer PI, the light-blocking member (182a and 182b) and liquid crystals may directly contact each other, thus generating foreign matter. The light-blocking member (182a and 182b) may become thinner from a central part toward both ends thereof in a widthwise direction. Accordingly, light cannot be completely blocked at both ends of the light-blocking member (182a and 182b). This may result in the leakage of light at both ends of the light-blocking member (182a and 182b). In some cases, the light-blocking member (182a and 182b) may be formed in the gate line area and the data line area. Here, the light-blocking member (182a and 182b) formed in the data line area may have a smaller linewidth than the light-blocking member (182a and 182b) in the gate line area. In this case, the generation of foreign matter or the leakage of light may be more noticeable in the light-blocking member (182a and 182b) having a relatively smaller linewidth in the data line area.

To prevent the generation of foreign matter or the leakage of light, the LCD 10 according to the current embodiment may include openings (162a-1 through 162a-4), which may be through holes, in the organic layer 162. The openings (162a-1 through 162a-4) may extend in the second direction (e.g., the direction in which the data line 132 extends) on a boundary side of a pixel area. Here, the boundary side of the pixel area includes the gate line area and the data line area which define a pixel and refers to an area adjacent to a boundary of the pixel. The boundary side of the pixel area may include an area between the data line 132 and the pixel electrode (172-1 and 172-2) and an edge area of the pixel electrode (172-1 and 172-2). Here, the boundary of the pixel refers to the gate line area and the data line area which define the pixel.

Since the light-blocking member (182a and 182b) is disposed in the openings (162a-1 through 162a-4) formed in the organic layer 162, a step height of the light-blocking member (182a and 182b) can be reduced. Accordingly, the alignment layer PI can be formed on the whole of the light-blocking member (182a and 182b). This can prevent potential generation of unwanted matter due to direct contact between the light-blocking member (182a and 182b) and the liquid crystals.

In addition, since the light-blocking member (182a and 182b) is disposed in the openings (162a-1 through 162a-4) formed in the organic layer 162, both ends of the light-blocking member (182a and 182b) are relatively thick compared with when the light-blocking member (182a and 182b) is formed on a flat organic layer without the openings (162a-1 through 162a-4). Accordingly, this can sufficiently prevent the leakage of light at ends of the light-blocking member (182a and 182b).

Figure 5:
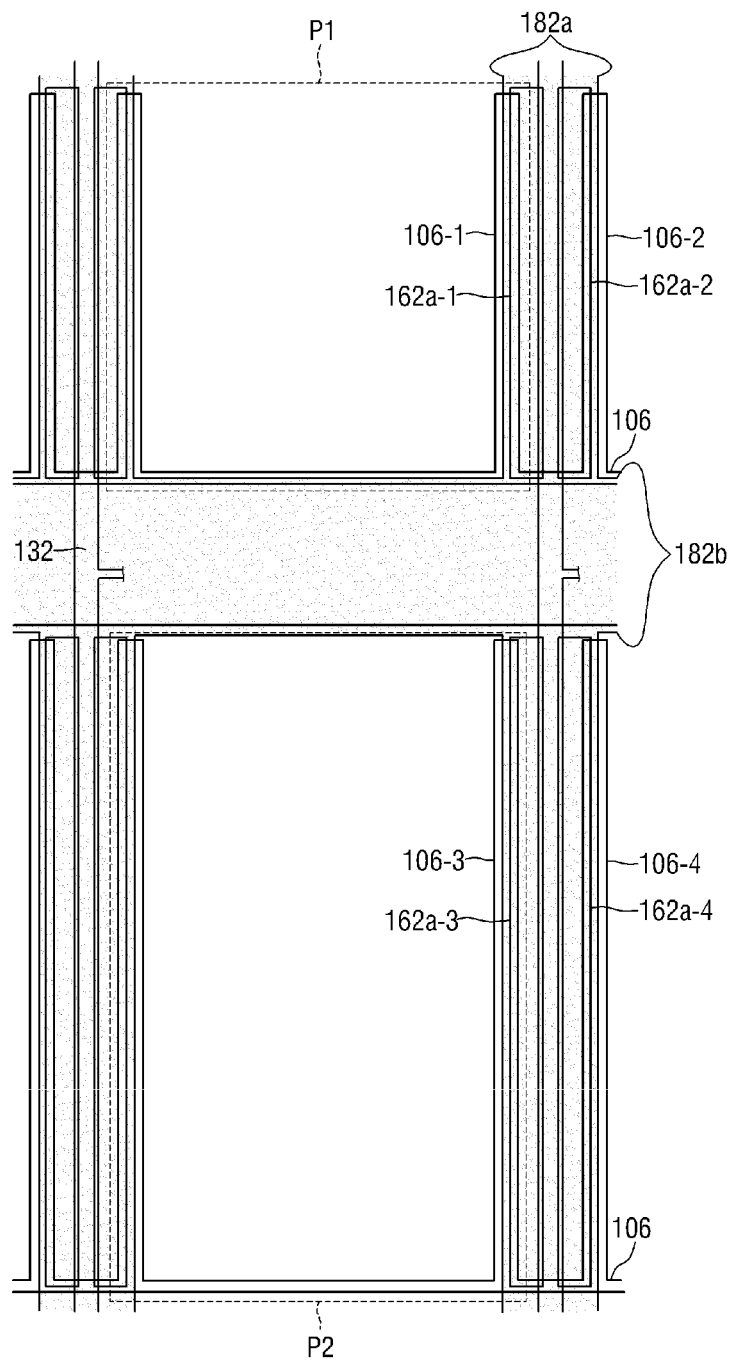
FIG. 5 is a schematic plan view illustrating light-blocking members positioned inside openings in an organic layer of an LCD according to an embodiment.

Referring to FIGS. 4 and 5, in some embodiments, the openings (162a-1 through 162a-4) formed in the organic layer 162 may include a first opening 162a-1, a second opening 162a-2, a third opening 162a-3, and a fourth opening 162a-4. The first opening 162a-1 and the third opening 162a-3 may be formed on the boundary side of the pixel area, specifically, on a side (e.g., the left side in the drawing) of the data line 132, and the second opening 162a-2 and the fourth opening 162a-4 may be formed on the boundary side of the pixel area, specifically, on the other side (e.g., the right side in the drawing) of the data line 132 which is opposite the above side. The first opening 162a-1 and the second opening 162a-2 may be formed on a side (an upper side in the drawing) of the gate line 102, and the third opening 162a-3 and the fourth opening 162a-4 may be formed on the other side (a lower side in the drawing) of the gate line 102.

In the embodiment of FIGS. 4 and 5, the second light-blocking member 182b may be disposed in the openings (162a-1 through 162a-4). In other words, the openings (162a-1 through 162a-4) may overlap the second light-blocking member 182b.

As apparent from FIG. 4, a width of the second light-blocking member 182b may be greater than the sum of a width W3 of the first opening 162a-1 and a width W4 of the second opening 162a-2. The first opening 162a-1 and the second opening 162a-2 may be disposed inside the second light-blocking member 182b. Here, a width may refer to a width in the horizontal direction (the Y direction) in the drawing. Substantially the same may apply to the third opening 162a-3 and the fourth opening 162a-4.

In some embodiments, the width of the second light-blocking member 182b may be greater than that of the data line 132. A centerline of the second light-blocking member 182b may be substantially the same as a centerline of the data line 132. Accordingly, the data line 132 may be disposed in a central part of the second light-blocking member 182b.

Referring to FIG. 4, in some embodiments, at least part of the second light-blocking member 182b positioned in the first opening 162a-1 and at least part of the second light-blocking member 182b positioned in the second opening 162a-2 may overlap the data line 132. Substantially the same may apply to the third opening 162a-3 and the fourth opening 162a-4. However, this is merely an example, and the positional relationship between the openings (162a-1 through 162a-4) and the data line 132 is not limited to this example.

In some embodiments, the storage electrode line 106 may include the first storage electrode 106-1 and the third storage electrode 106-3 separated to a side from the data line 132 by a predetermined distance W1 and the second storage electrode 106-2 and the fourth storage electrode 106-4 separated to the other side from the data line 132 by a predetermined distance W2. The first storage electrode 106-1 and the second storage electrode 106-2 may be formed on a side (the upper side in the drawing) of the gate line 102, and the third storage electrode 106-3 and the fourth storage electrode 106-4 may be formed on the other side (the lower side in the drawing) of the gate line 102.

Referring to FIG. 4, the distance W1 by which the first storage electrode 106-1 is separated from the data line 132 may be smaller than the width W3 of the first opening 162a-1, and the distance W2 by which the second storage electrode 106-2 is separated from the data line 132 may be smaller than the width W4 of the second opening 162a-2. Accordingly, at least part of the first storage electrode 106-1 may be disposed inside the first opening 162a-1, and at least part of the second storage electrode 106-2 may be disposed inside the second opening 162a-2. In other words, at least part of an area between the first storage electrode 106-1 and the data line 132 may be disposed inside the first opening 162a-1, and at least part of an area between the second storage electrode 106-2 and the data line 132 may be disposed inside the second opening 162a-2. Substantially the same may apply to the third storage electrode 106-3 and the fourth storage electrode 106-4.

In this case, the leakage of light through the area between the first storage electrode 106-1 and the data line 132 can be prevented by the second light-blocking member 182b disposed in the first opening 162a-1, and the leakage of light through the area between the second storage electrode 106-2 and the data line 132 can be prevented by the second light-blocking member 182b disposed in the second opening 162a-2. Substantially the same may apply to the third storage electrode 106-3 and the fourth storage electrode 106-4.

In some embodiments, the color filters disposed under the organic layer 162 may be exposed by the openings (162a-1 through 162a-4). For example, referring to FIG. 4, the red color filter 152R may be exposed by the first opening 162a-1, and the blue color filter 152B may be exposed by the second opening 162a-2. Substantially the same may apply to the third opening 162a-3 and the fourth opening 162a-4.

In some embodiments, the color filters may also be disposed at the boundary of the pixel. For example, referring to FIG. 4, the red color filter 152R and the blue color filter 152B may be disposed on the data line 132, which is the boundary of the pixel, to overlap each other. In some embodiments, when seen from above, each of the first opening 162a-1, the second opening 162a-2, the third opening 162a-3 and the fourth opening 162a-4 may be rectangular as illustrated in FIG. 5.

Referring to FIG. 5, in some embodiments, the first opening 162a-1 and the third opening 162a-3 may be separated from each other in the second direction (the Y direction), and the second opening 162a-2 and the fourth opening 162a-4 may be separated from each other in the second direction (the Y direction). However, this is merely an example, and they can also be connected to each other instead of being separated from each other.

Figure 6:
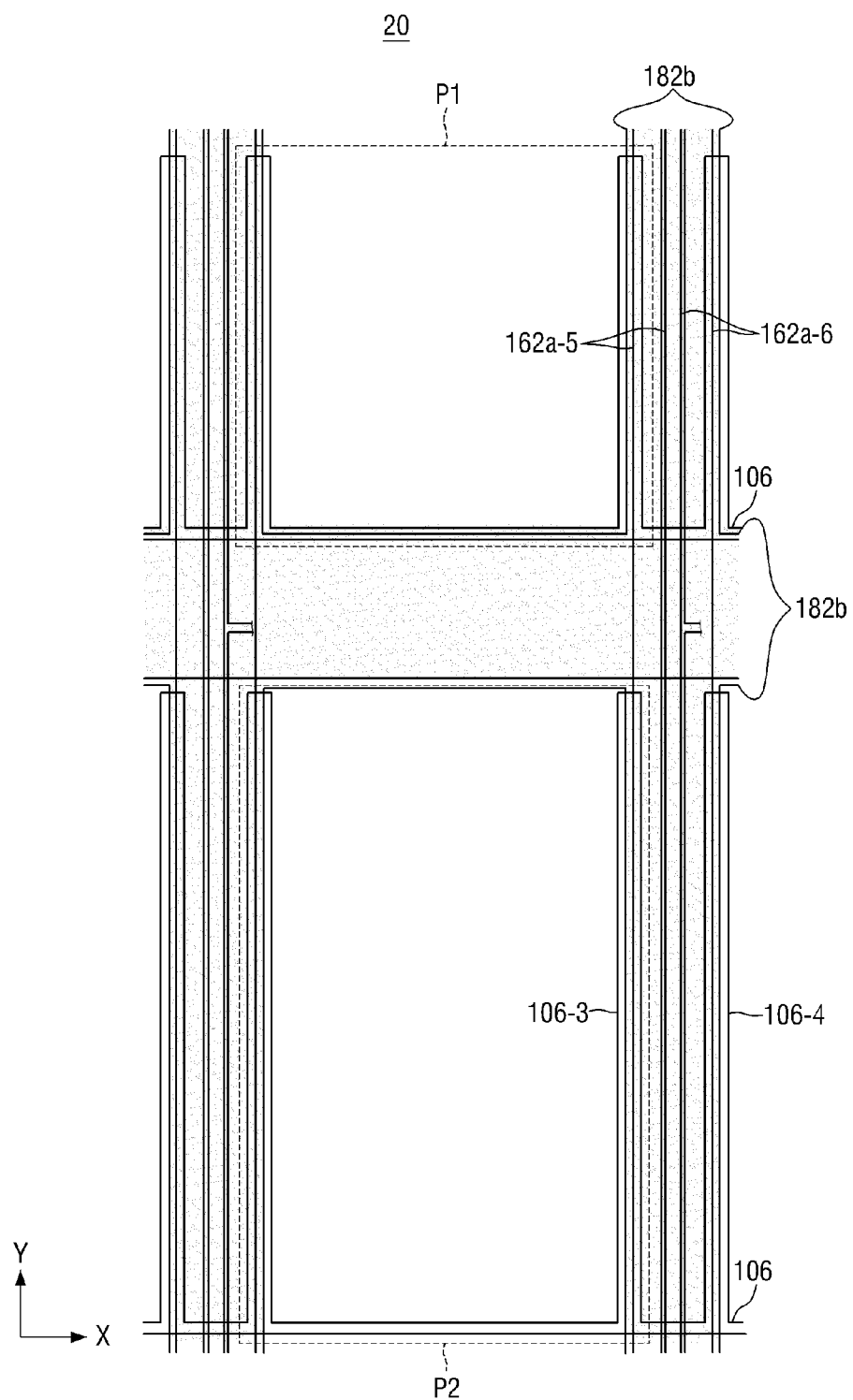
FIG. 6 is a schematic plan view illustrating light-blocking members positioned inside openings in an organic layer of an LCD according to an embodiment.

FIG. 6 is a plan view of openings in an organic layer 162 of an LCD 20 according to an embodiment.

Referring to FIG. 6, the LCD 20 according to the current embodiment may be identical or similar to the LCD 10 described above with reference to FIGS. 1 through 5 except for a fifth opening 162a-5 and a sixth opening 162a-6 formed in the organic layer 162. Thus, the current embodiment will hereinafter be described, focusing mainly on differences with the embodiment of FIGS. 1 through 5.

In the current embodiment, the fifth opening 162a-5 may be formed on a boundary side of a pixel area, specifically, on a side (a left side in the drawing) of a data line 132, and the sixth opening 162a-6 may be formed on the boundary side of the pixel area, specifically, on the other side (e.g., a right side in the drawing) of the data line 132 which is opposite the above side.

The fifth opening 162a-5 and the sixth opening 162a-6 may extend in a second direction (e.g., a direction in which the data line 132 extends) on the boundary side of the pixel area and traverse an area in which a gate line 102 is disposed. In other words, the fifth opening 162a-5 and the sixth opening 162a-6 may traverse a first light-blocking member 182a. That is, each of the fifth opening 162a-5 and the sixth opening 162a-6 may be formed as a single opening over a first subpixel area P1 and a second subpixel area P2.

In some embodiments, each of the fifth opening 162a-5 and the sixth opening 162a-6 may extend along a boundary of a pixel. However, this is merely an example, and each of the fifth opening 162a-1 and the sixth opening 162a-6 may be broken or interrupted at each boundary of the pixel.

A case where the organic layer 162 includes the openings (162a-1 through 162a-4) has been described above with reference to FIGS. 1 through 5. In some embodiments, the organic layer 162 can also include steps formed at locations corresponding to the openings (162a-1 through 162a-4), instead of the openings (162a-1 through 162a-4).

Figure 7:
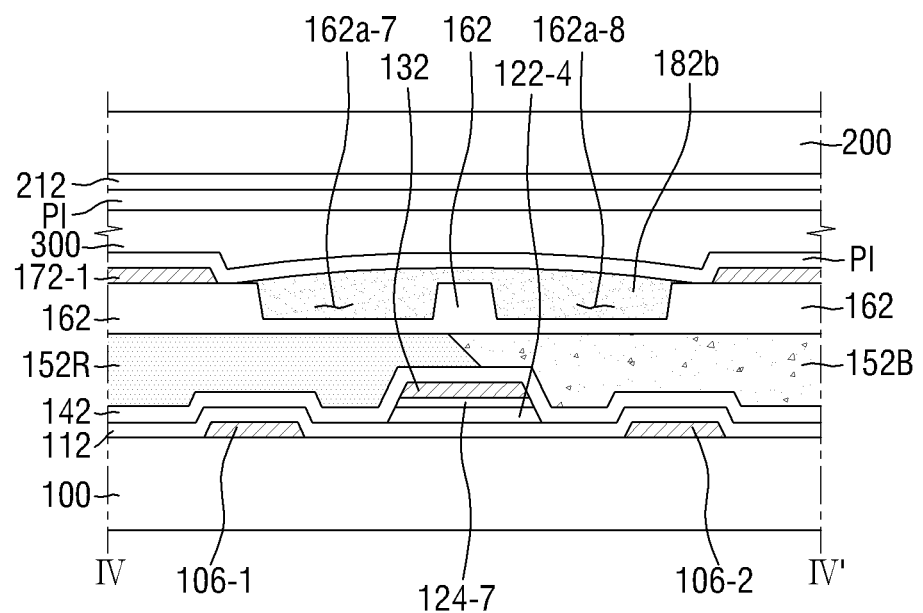
FIG. 7, FIG. 8, FIG. 9, FIG. 10, FIG. 11, and FIG. 12 are schematic cross-sectional views of LCDs, taken along a line corresponding to the line IV-IV' of FIG. 2 according to one or more embodiments.

FIG. 7 is a cross-sectional view of an LCD 30 taken along a line corresponding to the line IV-IV' of FIG. 2 according to an embodiment.

Referring to FIG. 7, the LCD 30 according to the current embodiment may be identical or similar to the LCD 10 described above with reference to FIGS. 1 through 5 except for steps (162a-7 and 162a-8), or recesses, formed in an organic layer 162. Thus, the current embodiment will hereinafter be described, focusing mainly on differences with the embodiment of FIGS. 1 through 5.

In the current embodiment, the steps (162a-7 and 162a-8) may include a first step 162a-7 (or first recess 162a-7) formed at a location corresponding to the first opening 162a-1 described above with reference to FIGS. 1 through 5 and a second step 162a-8 (or second recess 162a-7) formed at a location corresponding to the second opening 162a-2 described above with reference to FIGS. 1 through 5. Although not illustrated in the drawing, the LCD 30 according to the current embodiment may further include steps formed at locations respectively corresponding to the third opening 162a-3 and the fourth opening 162a-4 described above with reference to FIGS. 1 through 5.

The first step 162a-7 may be formed on a boundary side of a pixel area, specifically, on a side (e.g., a left side in the drawing) of a data line 132, and the second step 162a-8 may be formed on the boundary side of the pixel area, specifically, on the other side (e.g., a right side in the drawing) of the data line 132 which is opposite the above side.

Since a second light-blocking member 182b is disposed in the first step 162a-7 and the second step 162a-8 formed in the organic layer 162, a step height of the second light-blocking member 182b can be reduced. Accordingly, an alignment layer PI can be formed on the whole of the second light-blocking member 182b, thereby preventing the generation of foreign matter due to the direct contact of the second light-blocking member 182b with liquid crystals.

In addition, since the second light-blocking member 182b is formed in the first step 162a-7 and the second step 162a-8 formed in the organic layer 162, both ends of the second light-blocking member 182b are relatively thick compared with when the second light-blocking member 182b is formed on a flat organic layer without the first and second steps 162a-7 and 162a-8. Accordingly, this can prevent the leakage of light at both ends of the second light-blocking member 182b.

The relationship of the first and second steps 162a-7 and 162a-8 with the second light-blocking member 182b, the data line 132, and first and second storage electrodes 106-1 and 106-2 is substantially the same as or analogous to the relationship of the first and second openings 162a-1 and 162a-2 with the second light-blocking member 182b, the data line 132, and the first and second storage electrodes 106-1 and 106-2 described above with reference to FIGS. 1 through 5.

Although not illustrated in the drawing, the LCD 30 according to the current embodiment may further include steps formed at locations respectively corresponding to the third opening 162a-3 and the fourth opening 162a-4 described above with reference to FIGS. 1 through 5. The description of the third opening 162a-3 and the fourth opening 162a-4 can apply substantially the same to the above steps.

Figure 8:
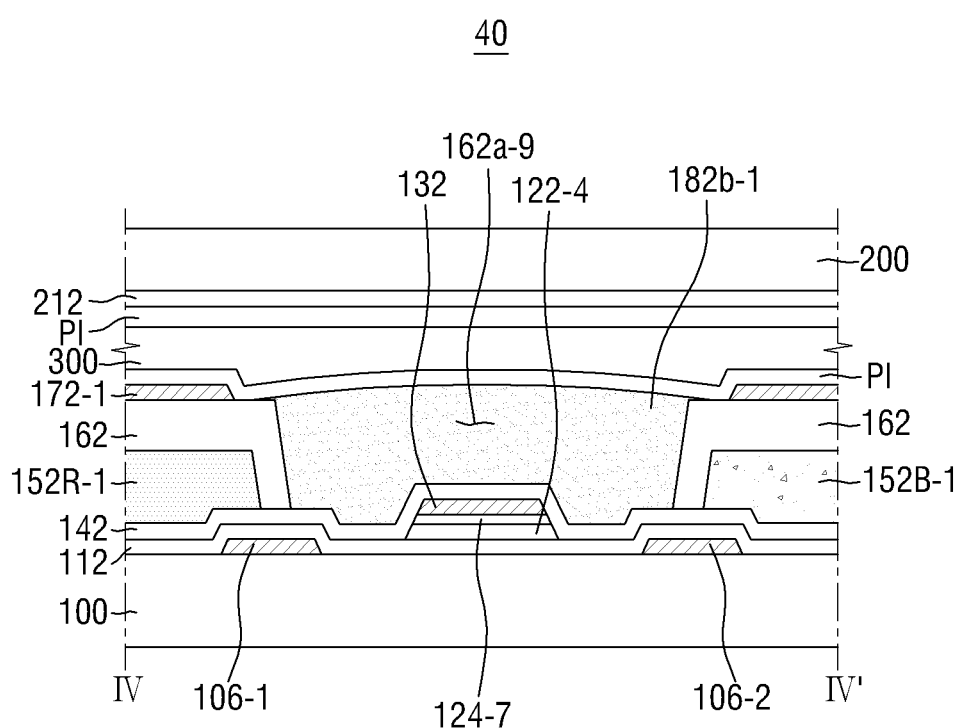

The planar shape of each of the first and second steps 162a-7 and 162a-8 and the form in which the first and second steps 162a-7 and 162a-8 extend may be substantially the same as or analogous to those of the openings (162a-1 through 162a-4) described above with reference to FIGS. 4 and 5. FIG. 8 is a cross-sectional view of an LCD 40 taken along a line corresponding to the line IV-IV' of FIG. 2 according to an embodiment.

Referring to FIG. 8, the LCD 40 according to the current embodiment may be identical or similar to the LCD 10 described above with reference to FIGS. 1 through 5 except for an opening 162a of an organic layer 162, a second light-blocking member 182b-1, and color filters (152R-1 and 152B-1). Thus, the current embodiment will hereinafter be described, focusing mainly on differences with the embodiment of FIGS. 1 through 5.

In some embodiments, a width of the opening 162a-9 may be greater than that of a data line 132 as illustrated in FIG. 8. Accordingly, at least part of the data line 132 may be located inside the opening 162a-9. The second light-blocking member 182b-1 may be disposed in the opening 162a-9. A width of the second light-blocking member 182b-1 may be greater than that of the opening 162a-9. Here, the width may refer to a width in a horizontal direction (a Y direction) in the drawing.

In some embodiments, a centerline of the data line 132 may be substantially the same as a centerline of the opening 162a-9. Accordingly, a portion of the data line 132 which is disposed inside the opening 162a-9 may be located in a central part of the opening 162a-9.

In some embodiments, the color filters (152R-1 and 152B-1) may not contact each other at a boundary of a pixel but may be separated from each other at the boundary of the pixel. For example, referring to FIG. 8, a red color filter 152R-1 and a blue color filter 152B-1 may be separated from each other at the boundary of the pixel, i.e., in a data line area.

In some embodiments, as illustrated in FIG. 8, at least part of the opening 162a-9 may overlap a first storage electrode 106-1 and a second storage electrode 106-2 disposed thereunder. In this case, the leakage of light through an area between the first storage electrode 106-1 and the data line 132 and through an area between the second storage electrode 106-2 and the data line 132 can be prevented by the second light-blocking member 182b-1.

While the first opening 162a-1 and the second opening 162a-2 are separated from each other in FIGS. 1 through 5, the opening 162a-9 according to the current embodiment may be an integrated version of the first opening 162a-1 and the second opening 162a-2.

The planar shape of the opening 162a-9 and the form in which the opening 162a-9 extends may be substantially the same as or analogous to those of the openings (162a-1 through 162a-4) described above with reference to FIGS. 4 and 5.

Figure 9:
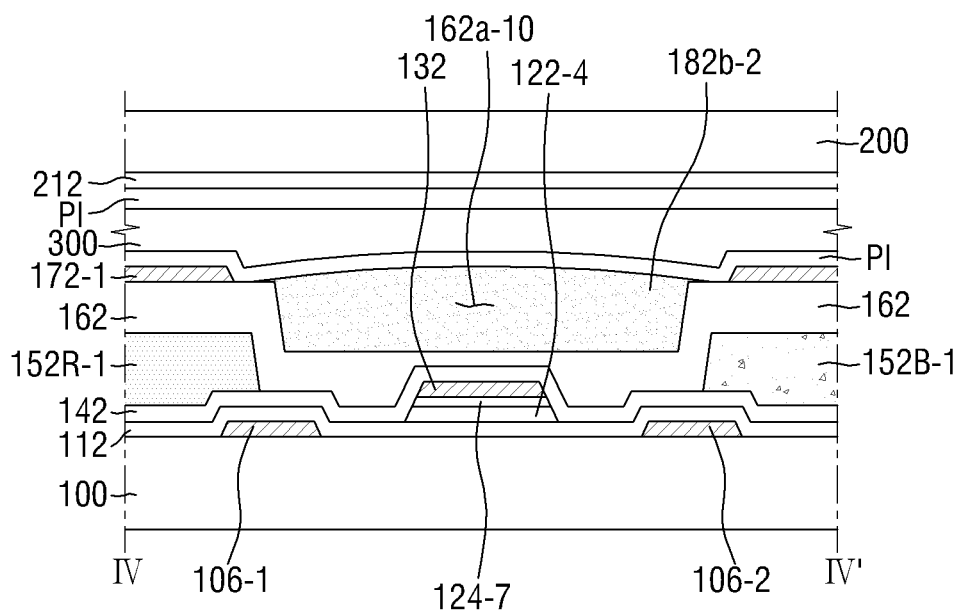

FIG. 9 is a cross-sectional view of an LCD 50 taken along a line corresponding to the line IV-IV' of FIG. 2 according to an embodiment.

Referring to FIG. 9, the LCD 50 according to the current embodiment may be identical or similar to the LCD 40 described above with reference to FIG. 8 except for a step 162a-10 formed in an organic layer 162. Thus, the current embodiment will hereinafter be described, focusing mainly on differences with the embodiment of FIG. 8.

In the current embodiment, the step 162a-10 may be formed at a location corresponding to the opening 162a-9 described above with reference to FIG. 8. That is, a width of the step 162a-10 may be greater than that of a data line 132 as illustrated in FIG. 9. Accordingly, at least part of the data line 132 may be located inside the step 162a-10. A second light-blocking member 182b-2 may be disposed in the step 162a-10. A width of the second light-blocking member 182b-2 may be greater than that of the step 162a-10. Here, the width may refer to a width in a horizontal direction (a Y direction) in the drawing.

In some embodiments, a centerline of the data line 132 may be substantially the same as a centerline of the step 162a-10. Accordingly, a portion of the data line 132 which is disposed inside the step 162a-10 may be located in a central part of the step 162a-10.

The description of the opening 162a-9 made with reference to FIG. 8 may apply substantially the same to the step 162a-10 according to an embodiment.

Figure 10:
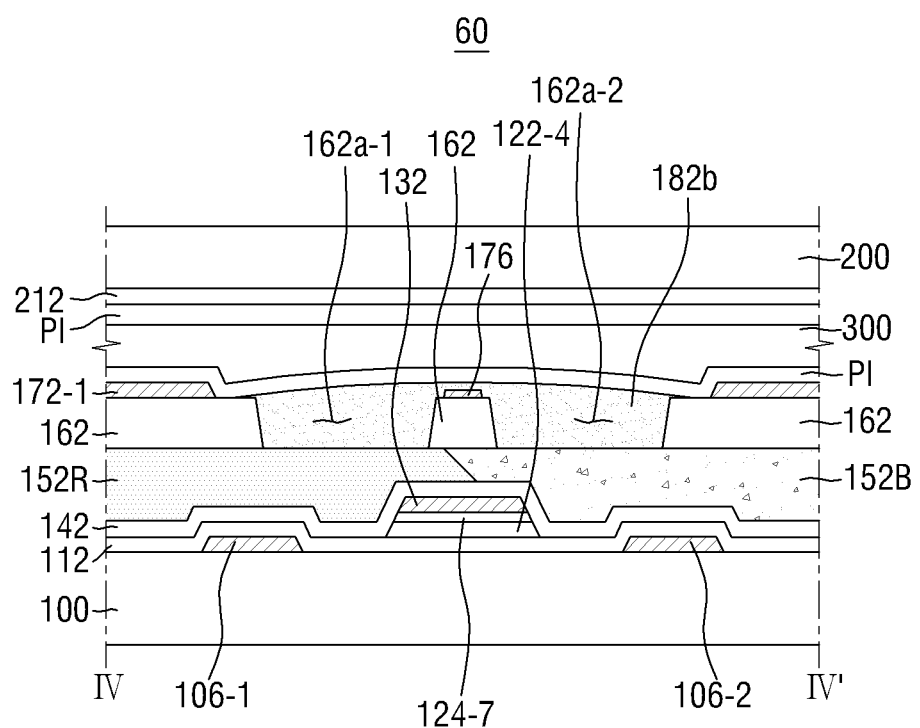

FIG. 10 is a cross-sectional view of an LCD 60 taken along a line corresponding to the line IV-IV' of FIG. 2 according to an embodiment.

Referring to FIG. 10, the LCD 60 according to the current embodiment may be identical or similar to the LCD 10 described above with reference to FIGS. 1 through 5 except for a shielding electrode 176. Thus, the current embodiment will hereinafter be described, focusing mainly on differences with the embodiment of FIGS. 1 through 5.

An electric field formed between a pixel electrode (172-1 and 172-2) and a common electrode 212 may be relatively weak in an area between a data line 132 and the pixel electrode (172-1 and 172-2). Accordingly, liquid crystal molecules may be misaligned.

To prevent the misalignment of the liquid crystal molecules, in some embodiments, the shielding electrode 176 may be placed on a boundary side of a pixel area. Specifically, as illustrated in FIG. 10, the shielding electrode 176 may be placed in an area corresponding to the data line 132. In other words, the shielding electrode 176 may overlap the data line 132.

The shielding electrode 176 may be physically separated from a first subpixel electrode 172-1 and a second subpixel electrode 172-2. The first subpixel electrode 172-1 and the second subpixel electrode 172-2 may be disposed at the same level. That is, like the first subpixel electrode 172-1 and the second subpixel electrode 172-2, the shielding electrode 176 may be disposed on the organic layer 162 and directly contact the organic layer 162. The shielding electrode 176 may be made of a transparent conductive material and may be made of the same material as the pixel electrode (172-1 and 172-2).

In some embodiments, a voltage (e.g., a common voltage) at the same level as a voltage applied to the common electrode 212 may be applied to the shielding electrode 176. Accordingly, an electric field may not be formed between the common electrode 212 and the shielding electrode 176. This can reduce the probability of misalignment of the liquid crystal molecules located in an area adjacent to the data line 132 and the leakage of light. Since the shielding electrode 176 may minimize light leakage, the size of a light-blocking member (182a and 182b) can minimized. Advantageously, an aperture ratio of the LCD 60 can be maximized.

Figure 11:
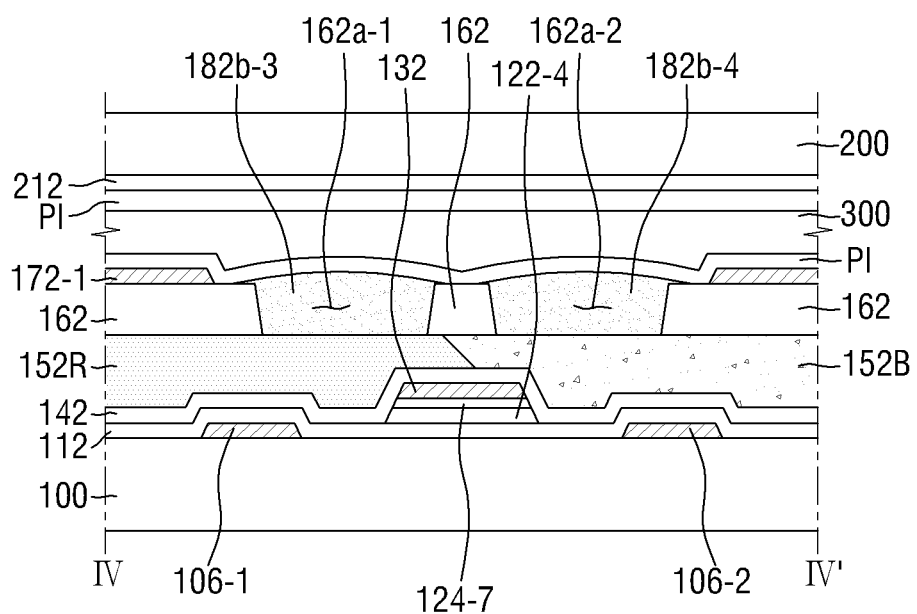

FIG. 11 is a cross-sectional view of an LCD 70 taken along a line corresponding to the line IV-IV' of FIG. 2 according to an embodiment.

Referring to FIG. 11, the LCD 70 according to the current embodiment may be identical or similar to the LCD 10 described above with reference to FIGS. 1 through 5 except for a second light-blocking member (182b-3 and 182b-4). Thus, the current embodiment will hereinafter be described, focusing mainly on differences with the embodiment of FIGS. 1 through 5.

In some embodiments, the second light-blocking member (182b-3 and 182b-4) may include a $(2-1)^{th}$ light-blocking member 182b-3 and a $(2-2)^{th}$ light-blocking member 182b-4. The $(2-1)^{th}$ light-blocking member 182b-3 may be disposed in a first opening 162a-1, and the $(2-2)^{th}$ light-blocking member 182b-4 may be disposed in a second opening 162a-2.

A width of the $(2-1)^{th}$ light-blocking member 182b-3 may be greater than that of the first opening 162a-1. A centerline of the $(2-1)^{th}$ light-blocking member 182b-3 may be substantially the same as a centerline of the first opening 162a-1.

A width of the $(2-2)^{th}$ light-blocking member 182b-4 may be greater than that of the second opening 162a-2. A centerline of the $(2-2)^{th}$ light-blocking member 182b-4 may be substantially the same as a centerline of the second opening 162a-2.

The $(2-1)^{th}$ light-blocking member 182b-3 and the $(2-2)^{th}$ light-blocking member 182b-4 may be separated from each other in a first direction (an X direction) by a predetermined gap. Accordingly, the second light-blocking member (182b-3 and 182b-4) may include an opening in an area between the $(2-1)^{th}$ light-blocking member 182b-3 and the $(2-2)^{th}$ light-blocking member 182b-4. In this case, the opening may partially expose a surface of the organic layer 162.

Figure 12:
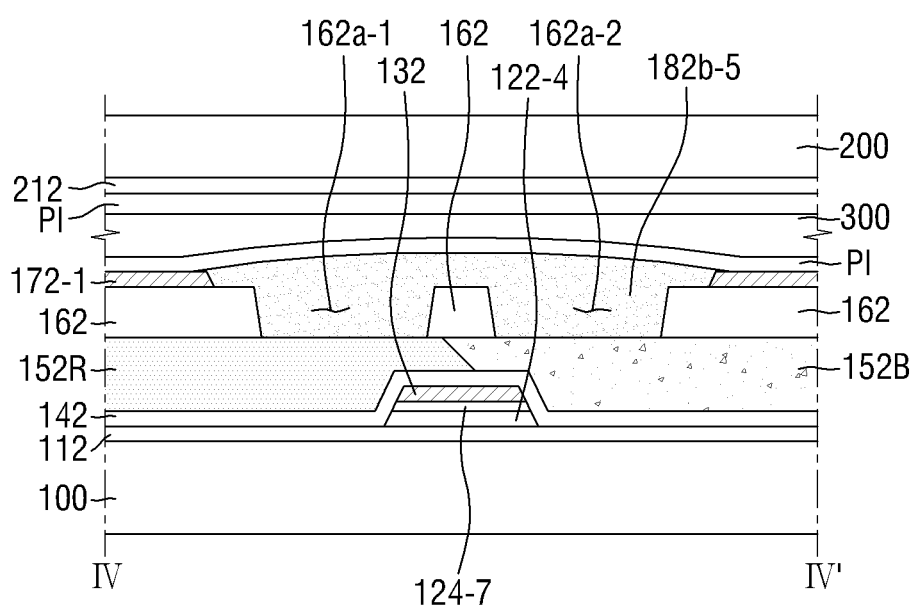

FIG. 12 is a cross-sectional view of an LCD 80 taken along a line corresponding to the line IV-IV' of FIG. 2 according to an embodiment.

Referring to FIG. 12, the LCD 80 according to the current embodiment may be identical or similar to the LCD 10 described above with reference to FIGS. 1 through 5 except for a second light-blocking member 182b-5 and the absence of a storage electrode line 106. Thus, the current embodiment will hereinafter be described, focusing mainly on differences with the embodiment of FIGS. 1 through 5.

In some embodiments, the second light-blocking member 182b-5 may be disposed in openings 162a-1 and 162a-2 and may directly contact at least part of a pixel electrode (172-1 and 172-2). The second light-blocking member 182b-5 may partially overlap an edge of the pixel electrode (172-1 and 172-2) in a first direction (an X direction). The second light-blocking member 182b-5 may partially contact the edge of the pixel electrode (172-1 and 172-2) in the first direction (the X direction).

Figure 13:
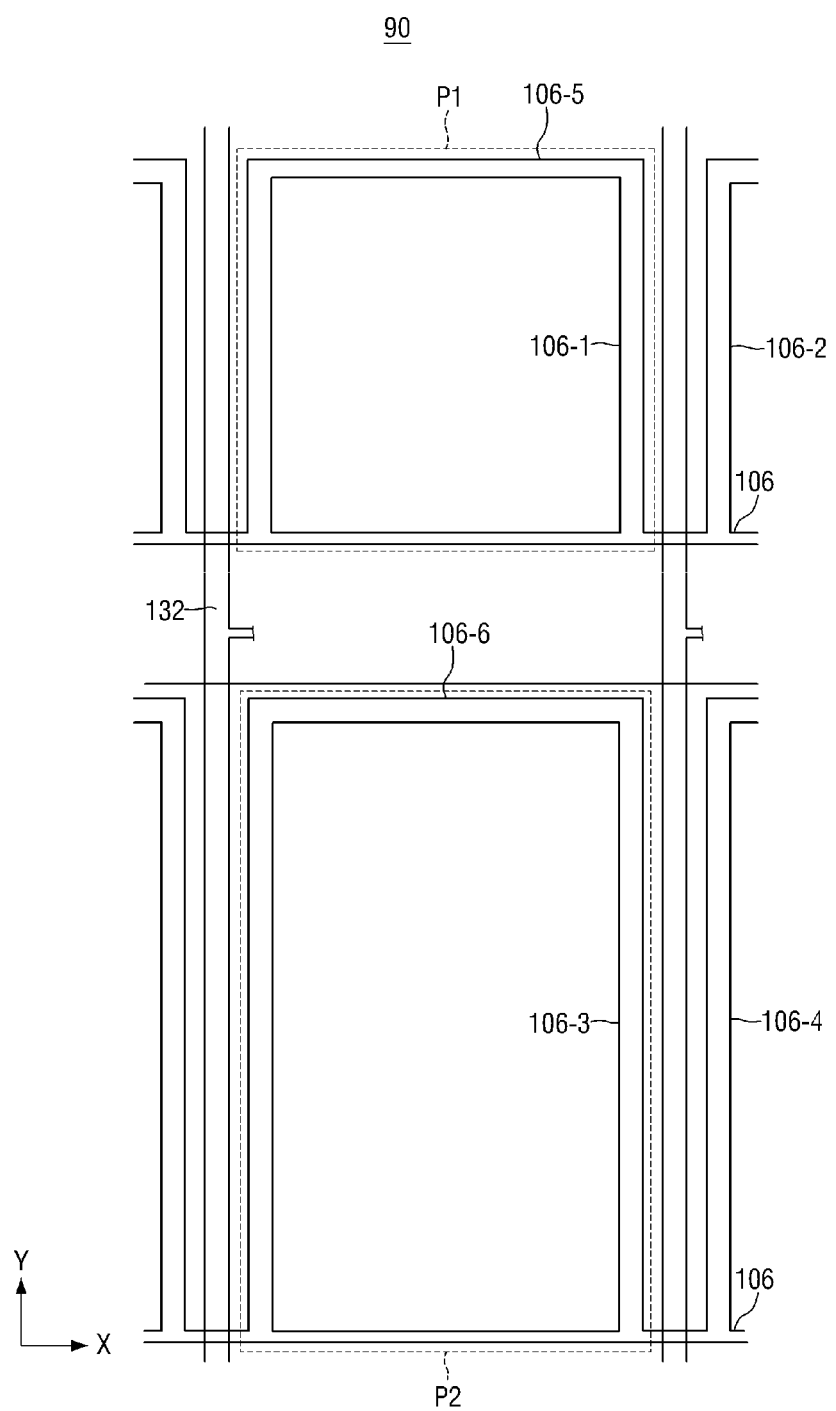
FIG. 13 is a schematic plan view illustrating a storage electrode line of an LCD according to an embodiment.

FIG. 13 is a plan view of a storage electrode line 106 of an LCD 90 according to an embodiment.

Referring to FIG. 13, the LCD 90 according to the current embodiment may be identical or similar to the LCD 10 described above with reference to FIGS. 1 through 5 except for a fifth storage electrode 106-5 and a sixth storage electrode 106-6. Thus, the current embodiment will hereinafter be described, focusing mainly on differences with the embodiment of FIGS. 1 through 5.

In some embodiments, the storage electrode line 106 may include the fifth storage electrode 106-5 and the sixth storage electrode 106-6. The fifth storage electrode 106-5 and the sixth storage electrode 106-6 may extend in a first direction (an X direction). The fifth storage electrode 106-5 may be disposed in a first subpixel area P1, and the sixth storage electrode 106-6 may be disposed in a second subpixel area P2.

At least part of a first subpixel electrode 172-1 may be surrounded by a first storage electrode 106-1, a second storage electrode 106-2, and the fifth storage electrode 106-5. At least part of a second subpixel electrode 172-2 may be surrounded by a third storage electrode 106-3, a fourth storage electrode 106-4, and the sixth storage electrode 106-6.

Referring to FIG. 2, FIG. 3, FIG. 4, FIG. 5, FIG. 6, FIG. 7, FIG. 8, FIG. 9, FIG. 10, FIG. 11, FIG. 12, and FIG. 13, a display device (e.g., an LCD) may include a first pixel electrode (e.g., a pixel electrode that includes the subpixel electrode 172-1), a second pixel electrode (e.g., a pixel electrode that immediately neighbors the subpixel electrode 172-1), an organic layer 162, and a light-blocking member (e.g., 182b, 182b-1, 182b-2, 182b-3, 182b-4, or 182b-5). The organic layer 162 may include a first organic portion (e.g., left organic portion) and a second organic portion (e.g., right organic portion). The first organic portion may overlap the first pixel electrode (such that a first geometric line perpendicular to a bottom side of the organic layer 162 may cross both the first organic portion and the first pixel electrode) and may be spaced from the second organic portion. The second organic portion may overlap a second pixel electrode (such that a second geometric line perpendicular to the bottom side of the organic layer 162 may cross both the second organic portion and the second pixel electrode). The light-blocking member 182b may be positioned between the first organic portion and the second organic portion.

Referring to FIG. 4, FIG. 5, FIG. 6, FIG. 7, FIG. 10, FIG. 11, and FIG. 12, the organic layer 162 may include a third organic portion (e.g., center organic portion). The third organic portion may be positioned between the first organic portion and the second organic portion, may be spaced from each of the first organic portion and the second organic portion, and may overlap the data line 132 (such that a third geometric line perpendicular to the bottom side of the organic layer 162 may cross both the third organic portion and the data line).

Referring to FIG. 4, FIG. 5, FIG. 6, FIG. 7, FIG. 10, FIG. 11, and FIG. 12, at least an edge (e.g., left edge and/or right edge) of the third organic portion may be positioned between two edges of the data line 132 in a plan view of the display device.

Referring to FIG. 4, FIG. 5, FIG. 6, FIG. 7, FIG. 10, FIG. 11, and FIG. 12, the first storage electrode 106-1 may be electrically connected to the second storage electrode 106-2.

The data line 132 may be positioned between the first storage electrode 106-1 and the second storage electrode 106-2 in a plan view of the LCD 10. An edge of the first organic portion may be positioned between two edges of the first storage electrode 106-1 in the plan view of the display device.

Referring to FIG. 4, FIG. 5, FIG. 6, FIG. 7, FIG. 10, FIG. 11, and FIG. 12, the color filter 152R may overlap (and may directly contact) each of the first organic portion and the light-blocking member. The color filter 152B may overlap (and may directly contact) each of the second organic portion and the light-blocking member. The third organic portion may overlap an interface between the color filter 152R and the color filter 152B (such that a third geometric line perpendicular to the bottom side of the organic layer may cross both the third organic portion and the interface). The third organic portion may directly contact both the color filter 152R and the color filter 152B. The interface (between the color filter 152R and the color filter 152B) may be positioned between the data line 132 and the third organic portion.

Referring to FIG. 4, FIG. 5, FIG. 6, FIG. 7, FIG. 10, FIG. 11, and FIG. 12, a minimum distance between the first organic portion and the second organic portion may be greater than a width of the data line (in a direction parallel to the bottom side of the organic layer 162 and perpendicular to the data line 132).

Referring to FIG. 4, FIG. 5, FIG. 6, FIG. 7, FIG. 10, FIG. 11, and FIG. 12, a geometric centerline of the data line 132 may be identical to a geometric centerline of the light-blocking member 182b in a plan view or cross-sectional view of the display device.

Referring to FIG. 3, the liquid crystal layer 300 may include liquid crystal molecules (well-known and not illustrated) and may overlap at least one of the first pixel electrode and the second pixel electrode. The spacer 184 may be positioned between two portions of the liquid crystal layer 300 and may be directly connected to the light-blocking member 182a (which may be directly connected to the light-blocking member 182b). The alignment layer PI may directly contact the light-blocking member 182a, may directly contact the liquid crystal layer 300, may directly contact at least three sides of the spacer 184 in a cross-sectional view of the LCD 10, and may affect orientations of some of the liquid crystal molecules.

Referring to FIG. 5, FIG. 6, FIG. 7, and FIG. 9, a display device (e.g., an LCD) may include a first pixel electrode (e.g., a pixel electrode that includes the subpixel electrode 172-1), a second pixel electrode (e.g., a pixel electrode that immediately neighbors the subpixel electrode 172-1), an organic layer 162, and a light-blocking member (e.g., 182b or 182b-2). The organic layer 162 may include a first organic portion (e.g., left thick organic portion) and a second organic portion (e.g., right thick organic portion). The first organic portion may overlap the first pixel electrode (such that a first geometric line perpendicular to a bottom side of the organic layer 162 may cross both the first organic portion and the first pixel electrode) and may be spaced from the second organic portion. The second organic portion may overlap a second pixel electrode (such that a second geometric line perpendicular to the bottom side of the organic layer 162 may cross both the second organic portion and the second pixel electrode). The light-blocking member 182b may be positioned between the first organic portion and the second organic portion.

Referring to FIG. 7 and FIG. 9, the organic layer 162 may include a third organic portion (e.g., left thin organic portion illustrated in FIG. 7 or center organic portion illustrated in FIG. 9). The third organic portion may be positioned between the first organic portion and the second organic portion and may overlap the light-blocking member (182*b* or 182-*b*). A minimum thickness of the third organic portion may be less than each of a minimum thickness of the first organic portion and a minimum thickness of the second organic portion (in a direction perpendicular to the bottom side of the organic layer 162). A maximum thickness of the third organic portion (in the direction perpendicular to the bottom side of the organic layer) may be less than each of the minimum thickness of the first organic portion and the minimum thickness of the second organic portion (in the direction perpendicular to the bottom side of the organic layer 162). At least an edge (e.g., left edge and/or right edge) of the data line 132 may be positioned between two ends of the third organic portion in a plan view of the display device.

Referring to FIG. 7 and FIG. 9, the third organic portion may be wider than the data line 132 (in a directly parallel to the bottom side of the organic layer 162 and perpendicular to the data line 132).

Referring to FIG. 7, the organic layer 162 may include a fourth organic portion (e.g., center thick organic portion). The third organic portion (e.g., left thin organic portion) may be positioned between the first organic portion (e.g., left thick organic portion) and the fourth organic portion (e.g., center thick organic portion). The fourth organic portion may be positioned between the first organic portion and the second organic portion, may be spaced from each of the first organic portion and the second organic portion, may be connected through the third organic portion to the first organic portion, and may be thicker than the third organic portion (in the direction perpendicular to the bottom side of the organic layer 162).

Referring to FIG. 7, the organic layer 162 may include a fifth organic portion (e.g., right thin organic portion). The fourth organic portion (e.g., center thick organic portion) may be connected through the fifth organic portion (e.g., right thin organic portion) to the second organic portion (e.g., right thick organic portion). The fifth organic portion may be positioned between the fourth organic portion and the second organic portion and may be thinner than each of the fourth organic portion and the second organic portion (in the direction perpendicular to the bottom side of the organic layer).

Referring to FIG. 5, FIG. 6, and FIG. 7, a first edge of the data line 132 may be positioned between two ends of the third organic portion in a plan view of the display device. A second edge of the data line 132 may be positioned between two ends of the fifth organic portion in the plan view of the display device.

Referring to FIG. 5, FIG. 6, and FIG. 7, an edge (e.g., right edge) of the first organic portion (e.g., left thick organic portion) may be positioned between two edges of the storage electrode 106-1 in a plan view of the display device. An edge (e.g., right edge) of the storage electrode 106-1 may be positioned between two ends of the third organic portion (e.g., left thin organic portion) in the plan view of the display device.

Embodiments may provide at least one of the following advantages.

In an LCD according to an embodiment, a black column spacer (BCS) member and a liquid crystal layer may not directly contact each other. Therefore, satisfactory display characteristics of the LCD can be attained.

In an LCD according to an embodiment, leakage of light at ends of a light-blocking member can be minimized or prevented.

Embodiments have been disclosed for illustrative purposes. The disclosed embodiments do not limit possible embodiments. Those skilled in the art will appreciate that various modifications and applications are possible, without departing from the scope and spirit defined in the accompanying claims.

What is claimed is:
1. A display device comprising:
a first pixel electrode;
a second pixel electrode;
an organic layer, which comprises a first organic portion and a second organic portion, wherein the first organic portion overlaps the first pixel electrode and is spaced from the second organic portion, and wherein the second organic portion overlaps the second pixel electrode;
a light-blocking member positioned between the first organic portion and the second organic portion;
an alignment layer overlapping the light blocking member and directly contacting the light blocking member; and
a data line, wherein the organic layer comprises a third organic portion, and wherein the third organic portion is positioned between the first organic portion and the second organic portion, is spaced from each of the first organic portion and the second organic portion, and overlaps the data line.

2. The display device of claim 1, wherein at least an edge of the third organic portion is positioned between two edges of the data line in a plan view of the display device.

3. The display device of claim 1 comprising: a first storage electrode and a second storage electrode, wherein the first storage electrode is electrically connected to the second storage electrode, and wherein the data line is positioned between the first storage electrode and the second storage electrode in a plan view of the display device.

4. The display device of claim 3, wherein an edge of the first organic portion is positioned between two edges of the first storage electrode in the plan view of the display device.

5. The display device of claim 1 comprising: a first color filter, which overlaps each of the first organic portion and the light-blocking member.

6. The display device of claim 1 comprising: a data line, wherein the data line overlaps the light-blocking member, and wherein a minimum distance between the first organic portion and the second organic portion is greater than a width of the data line.

7. The display device of claim 1 comprising: a data line, wherein a geometric centerline of the data line is identical to a geometric centerline of the light-blocking member in a plan view of the display device.

8. The display device of claim 1 comprising a shielding electrode, wherein the organic layer comprises a third organic portion, wherein the third organic portion is positioned between the first organic portion and the second organic portion, is spaced from each of the first organic portion and the second organic portion, and directly contacts the shielding electrode.

9. The display device of claim 1, wherein the organic layer comprises a third organic portion, wherein the third organic portion is positioned between the first organic portion and the second organic portion and overlaps the light-blocking member, and wherein a minimum thickness of the third organic portion is less than each of a minimum thickness of the first organic portion and a minimum thickness of the second organic portion.

10. The display device of claim 9, wherein a maximum thickness of the third organic portion in a direction perpendicular to a bottom side of the organic layer is less than each of the minimum thickness of the first organic portion and the minimum thickness of the second organic portion.

11. The display device of claim 9 comprising: a data line, wherein at least an edge of the data line is positioned between two ends of the third organic portion in a plan view of the display device.

12. The display device of claim 11, wherein the third organic portion is wider than the data line.

13. The display device of claim 9, wherein the organic layer comprises a fourth organic portion, wherein the third organic portion is positioned between the first organic portion and the fourth organic portion, and wherein the fourth organic portion is positioned between the first organic portion and the second organic portion, is spaced from each of the first organic portion and the second organic portion, is connected through the third organic portion to the first organic portion, and is thicker than the third organic portion.

14. The display device of claim 13, wherein the organic layer comprises a fifth organic portion, wherein the fourth organic portion is connected through the fifth organic portion to the second organic portion, wherein the fifth organic portion is positioned between the fourth organic portion and the second organic portion and is thinner than each of the fourth organic portion and the second organic portion.

15. The display device of claim 14 comprising: a data line, wherein a first edge of the data line is positioned between two ends of the third organic portion in a plan view of the display device, and wherein a second edge of the data line is positioned between two ends of the fifth organic portion in the plan view of the display device.

16. The display device of claim 9 comprising: a storage electrode, wherein an edge of the first organic portion is positioned between two edges of the storage electrode in a plan view of the display device, and wherein an edge of the storage electrode is positioned between two ends of the third organic portion in the plan view of the display device.

17. A display device comprising:
a first pixel electrode;
a second pixel electrode;
an organic layer, which comprises a first organic portion and a second organic portion, wherein the first organic portion overlaps the first pixel electrode and is spaced from the second organic portion, and wherein the second organic portion overlaps the second pixel electrode;
a light-blocking member positioned between the first organic portion and the second organic portion;
an alignment layer overlapping the light blocking member and directly contacting the light blocking member;
a first color filter, which overlaps each of the first organic portion and the light-blocking member; and
a second color filter, which overlaps each of the second organic portion and the light-blocking member, wherein the organic layer comprises a third organic portion, wherein the third organic portion is positioned between the first organic portion and the second organic portion, is spaced from each of the first organic portion and the second organic portion, and overlaps an interface between the first color filter and the second color filter.

18. The display device of claim 17 comprising: a data line, wherein the interface between the first color filter and the second color filter is positioned between the data line and the third organic portion.

19. A display device comprising:
a first pixel electrode;
a second pixel electrode;
an organic layer, which comprises a first organic portion and a second organic portion, wherein the first organic portion overlaps the first pixel electrode and is spaced from the second organic portion, and wherein the second organic portion overlaps the second pixel electrode;
a light-blocking member positioned between the first organic portion and the second organic portion;
an alignment layer overlapping the light blocking member and directly contacting the light blocking member;
a liquid crystal layer, which overlaps at least one of the first pixel electrode and the second pixel electrode;
a spacer, which is positioned between two portions of the liquid crystal layer and is directly connected to the light-blocking member; and
an alignment layer, which directly contacts the light-blocking member, directly contacts the liquid crystal layer, and directly contacts at least three sides of the spacer.

20. A display device comprising:
a first pixel electrode;
a second pixel electrode;
an organic layer, which comprises a first organic portion and a second organic portion, wherein the first organic portion overlaps the first pixel electrode and is spaced from the second organic portion, and wherein the second organic portion overlaps the second pixel electrode;
a light-blocking member positioned between the first organic portion and the second organic portion; and
an alignment layer overlapping the light blocking member and directly contacting the light blocking member,
wherein a first face of the first organic portion directly contacts the first pixel electrode, and wherein a second face of the first organic portion directly contacts the light-blocking member and is at an angle relative to the first face of the first organic portion.

21. The display device of claim 20, wherein the alignment layer directly contacts both the first pixel electrode and a first surface of the light-blocking member, wherein a second surface of the light-blocking member directly contacts the second face of the first organic portion, and wherein a material of the first surface of the light-blocking member is identical to a material of the second surface of the light-blocking member.

* * * * *